(12) United States Patent
Hayashi et al.

(10) Patent No.: US 6,628,542 B2
(45) Date of Patent: Sep. 30, 2003

(54) MAGNETORESISTIVE DEVICE AND MAGNETIC MEMORY USING THE SAME

(75) Inventors: Hidekazu Hayashi, Tenri (JP); Masashi Michijima, Soraku-gun (JP); Ryoji Minakata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 175 days.

(21) Appl. No.: 09/755,905

(22) Filed: Jan. 5, 2001

(65) Prior Publication Data

US 2001/0040819 A1 Nov. 15, 2001

(30) Foreign Application Priority Data

| Jan. 7, 2000 | (JP) | 2000-001189 |
| Mar. 27, 2000 | (JP) | 2000-085563 |
| Mar. 29, 2000 | (JP) | 2000-090495 |
| Feb. 16, 2000 | (JP) | 2000-037527 |
| Feb. 2, 2000 | (JP) | 2000-024609 |

(51) Int. Cl.⁷ ............................................. G11C 11/00
(52) U.S. Cl. .................... 365/158; 365/171; 365/173
(58) Field of Search ......................... 365/158, 171, 365/173; 360/324.12

(56) References Cited

U.S. PATENT DOCUMENTS

| 5,347,485 A | 9/1994 | Taguchi et al. | |
| 6,104,632 A | * 8/2000 | Nishimura | 365/158 |
| 6,198,610 B1 | * 3/2001 | Kawawake et al. | 360/324.12 |
| 6,219,275 B1 | * 4/2001 | Nishimura | 365/173 |

FOREIGN PATENT DOCUMENTS

| EP | 0 959 475 A2 | 11/1999 |
| JP | 9-106514 | 4/1997 |
| JP | 10-134560 | 5/1998 |
| JP | 11-213650 | 8/1999 |

OTHER PUBLICATIONS

S. Shimanuki, et al. "Magnetic and Magneto–Optical Properties of Amorphous TbCo Films Prepared by Two Target Magnetron Co–sputtering", Applied Magnetism Society of Japan, vol. 10, No. 2, pp. 179–182 (1986). In Japanese with pertinent sections abstracted in English.

M. Naoe, "Lecture of Magnetic Thin Films V", Applied Magnetism Society of Japan, vol. 24, No. 1, pp. 25–33 (2000). In Japanese with pertinent sections abstracted in English.

* cited by examiner

Primary Examiner—Son T. Dinh
(74) Attorney, Agent, or Firm—David G. Conlin; David A. Tucker; Edwards & Angell, LLP

(57) ABSTRACT

A magnetoresistive device has a first magnetic layer, a nonmagnetic layer, and a second magnetic layer, with the nonmagnetic layer being interposed between the first and second magnetic layers, the first and second magnetic layers having perpendicular magnetic anisotropy. Either the first magnetic layer or the second magnetic layer is made of a ferrimagnetic that has a compensation point around a room temperature.

23 Claims, 17 Drawing Sheets

LONGITUDINAL DIRECTION

LATERAL DIRECTION

LONGITUDINAL DIRECTION

MAGNETORESISTIVE DEVICE AND MAGNETIC MEMORY USING THE SAME

BACKGROUND OF THE INVENTION

The present invention relates to a magnetoresistive element or device using a magnetic layer having perpendicular magnetic anisotropy, and also to a magnetic memory using the magnetoresistive devices. The invention further relates to a recording method for such magnetic memories.

GMR (Giant MagnetoResistive) devices and TMR (Tunnel MagnetoResistive) devices obtained by stacking magnetic layers and nonmagnetic layers can be expected to exhibit higher performance as magnetic sensors, by virtue of their having larger rates of change in magnetoresistance as compared with conventional AMR (Anisotropic MagnetoResistive) devices. GMR devices have already been put into practical use as read-use or playback magnetic heads for HDDs (Hard Disk Drives). TMR devices, on the other hand, which have even higher rates of change of magnetoresistance than GMR devices, are under discussion for applications to not only magnetic heads but also magnetic memories.

A fundamental structure of a conventional TMR device as shown in FIG. 1 is known (see, for example, Japanese Patent Laid-Open Publication HEI 9-106514). Referring now to FIG. 1, the TMR device is made up by stacking a first magnetic layer 31, an insulating layer 32, a second magnetic layer 33 and an antiferromagnetic layer 34. In this case, the first magnetic layer 31 and the second magnetic layer 33 are ferromagnetics made of Fe, Co, Ni or alloys of these, the antiferromagnetic layer 34 is made of FeMn, NiMn or the like, and the insulating layer 32 is made of $Al_2O_3$.

Replacing the insulating layer 32 in FIG. 1 with a nonmagnetic layer having electrical conductivity made of Cu or the like would result in a GMR device.

In conventional GMR devices and TMR devices, since the magnetic layers are magnetized along the layer surfaces, scale-down of the device dimensions as in magnetic heads of narrow track widths or magnetic memories of high integration would cause those devices to be strongly affected by diamagnetic fields generated at end-portion magnetic poles. For this reason, the direction of magnetization of the magnetic layers would become unstable, which in turn makes it hard to maintain uniform magnetization, and eventually leads to occurrence of operating failures of the devices such as the magnetic head and the magnetic memory.

As a solution to this drawback, a magnetoresistive device using a magnetic layer having perpendicular magnetic anisotropy is disclosed in Japanese Patent Laid-Open Publication HEI 11-213650. The device structure as taught in this publication is shown in FIG. 2. The magnetoresistive device is so structured that a nonmagnetic layer 42 is sandwiched between a first magnetic layer 41 formed of a perpendicularly magnetized film having a low coercive force and a second magnetic layer 43 formed of a perpendicularly magnetized film having a high coercive force. The first and second magnetic layers are provided by using a ferrimagnetic film made of rare earth—transition element alloys, a garnet film, PtCo, PdCo or the like.

In this case, since end-portion magnetic poles occur at the magnetic film surfaces, increases in diamagnetic fields due to the scale-down of devices are suppressed. Accordingly, if perpendicular magnetic anisotropy energy of the magnetic film is substantially larger than the diamagnetic field energy caused by the end-portion magnetic poles, the magnetization can be stabilized along the perpendicular direction regardless of the device dimensions.

However, in the magnetoresistive device using a magnetic layer having perpendicular magnetic anisotropy, end-portion magnetic poles occur at the magnetic film surfaces. Since the nonmagnetic layer to be used for GMR devices and TMR devices is extremely thin, a magnetic pole that occurs at the interface of one magnetic layer and the nonmagnetic layer affects the magnetization of the other magnetic layer so largely that the magnetization may not be reversed. Accordingly, when the magnetoresistive devices are applied to a magnetic memory as an example, there may occur problems that information to be stored cannot be written to the memory or that written information is dissipated.

Therefore, with a view to solving these and other problems, a first object of the present invention is to provide a magnetoresistive device, as well as a magnetic memory using the magnetoresistive device, which allows a magnetic layer to be maintained in a stable magnetized state without being affected by a leakage magnetic field applied from the other magnetic layer through an insulating layer.

In the aforementioned conventional magnetoresistive device, in order that the magnetization within the magnetic layer overcomes the effect of the diamagnetic field energy due to the end-portion magnetic poles so as to be directed perpendicular stably, it is preferable that the perpendicular magnetic anisotropy energy of the magnetic film be as large as possible. However, this normally causes the coercive force to also increase concurrently. Accordingly, when a conventional magnetoresistive device having a sufficiently stabilized perpendicularly magnetized film is applied to a magnetic memory, the coercive force of the recording layer will be excessively increased, which would make it hard to perform magnetization reversal by a magnetic field generated by a recording current.

Therefore, a second object of the present invention is to provide a magnetoresistive device, as well as a magnetic memory using the magnetoresistive device, which has a coercive force of such a magnitude as to allow the magnetization reversal to be performed and which stably holds magnetized information stored in its recording layer.

Now, the recording method for a magnetic memory using a perpendicularly magnetized film is explained by way of an example disclosed in the Japanese Patent Laid-Open Publication HEI 11-213650. The arrangement of magnetoresistive devices and write lines according to the teaching of the publication is shown in FIG. 3.

The device of FIG. 3, as in the case of FIG. 2, is made up of a first magnetic layer 21, a nonmagnetic layer 22 and a second magnetic layer 23. Assuming that the first magnetic layer 21 is a memory layer, information recording to the device is fulfilled by passing electric currents through write or recording lines 24, 25 provided on both sides of the device to thereby make the magnetization of the first magnetic layer 21 reversed by the magnetic fields generated from the current lines. For example, to make the first magnetic layer 21 magnetized upward of the device, currents are passed through the recording line 24 frontward of the drawing sheet, namely toward a direction in which a front side of the drawing sheet is facing, and through the recording line 25 backward of the drawing sheet, namely toward a direction in which a reverse side of the drawing sheet is facing. Since the resultant of the magnetic fields 27 generated from these two current lines is directed upward of the device, magnetization of the first magnetic layer 21 can be directed upward of the device.

However, locating the recording lines beside the magnetoresistive device would be disadvantageous for high integration of the device. In the case where the recording lines are located on both sides of the device as shown in FIG. 3, with a wiring rule (F) used, the distance between the adjoining devices is 4F. On the other hand, in the case of an ordinary array pattern with no recording lines provided between devices, the distance between the adjoining devices is 2F. From the viewpoint that high integration of devices is of importance for memory fabrication, the arrangement of the magnetic memory of FIG. 3 is disadvantageous to the increase of the integration.

Further, in the wiring pattern shown in FIG. 3, although devices located beside a selected device are not recorded, devices located in the anteroposterior direction of the selected device (namely, in a direction perpendicular to the drawing sheet) would be recorded. As a consequence, it would be impossible to select a device at a point of intersection in a matrix shape in which the devices are arrayed.

Therefore, in view of these problems, a third object of the present invention is to provide a magnetic memory having a higher level of integration than the conventional counterpart, and a recording method therefor, which memory allows information to be recorded to devices or memory cells at points of intersection in a matrix-form arrangement of devices.

SUMMARY OF THE INVENTION

The present invention provides a magnetoresistive device comprising a first magnetic layer, a nonmagnetic layer, and a second magnetic layer, with the nonmagnetic layer being interposed between the first and second magnetic layers, the first and second magnetic layers having perpendicular magnetic anisotropy, characterized in that:

the magnetoresistive device has a structure such that magnetization information can be recorded thereto and that recorded magnetization information is stably maintained therein.

More specifically, in one embodiment, either the first magnetic layer or the second magnetic layer is made of a ferrimagnetic that has a compensation point around a room temperature.

With this arrangement, even if the size of the device is reduced, it is possible to reduce effects of end-portion magnetic poles, and thus reduce the disturbance due to leaked magnetic fields. As a result, the perpendicular magnetization state is stably held.

In one embodiment, the first magnetic layer is made of a ferromagnetic having a low coercive force as well as perpendicular magnetic anisotropy, while the second magnetic layer is made of a ferromagnetic having a high coercive force as well as perpendicular magnetic anisotropy, and the ferromagnetic forming the second magnetic layer is a rare earth metal—transition metal amorphous alloy that has a small saturation magnetization. In this embodiment, similar effects are obtained.

In one embodiment, the first magnetic layer is made of a ferromagnetic having a coercive force low enough to allow magnetization reversal of the first magnetic layer and a magnetic anisotropy energy high enough to maintain the perpendicular magnetic anisotropy of the first magnetic layer.

Using the magnetoresistive devices with this construction can provide a magnetic memory that is rewritable and that can stably hold recorded information.

In one embodiment, the magnetoresistive device further comprises a third magnetic layer having perpendicular magnetic anisotropy and a second nonmagnetic layer which is interposed between the second and third magnetic layers. In this case, the second magnetic layer is made of a ferromagnetic having a coercive force low enough to allow magnetization reversal of the second magnetic layer and a magnetic anisotropy energy high enough to maintain the perpendicular magnetic anisotropy of the second magnetic layer.

The present invention also provides a magnetic memory using, as memory cells, the magnetoresistive devices of any type as described above.

Also, the present invention provides a magnetic memory using magnetoresistive devices, each magnetoresistive device having a first magnetic layer, a nonmagnetic layer, and a second magnetic layer, with the nonmagnetic layer being interposed between the first and second magnetic layers, the first and second magnetic layers having perpendicular magnetic anisotropy, characterized in that:

current lines for recording information to the magnetoresistive devices are provided in planes upper and lower than a plane on which the magnetoresistive devices are located.

The current lines may be positioned directly above and below the magnetoresistive devices. Alternatively, the current lines may be positioned obliquely above and below the magnetoresistive devices such that they are located in positions between mutually adjacent magnetoresistive devices.

With the above arrangement, higher integration or packing density is achievable.

In one embodiment, the magnetoresistive devices are arranged in matrix shape, and the current lines in the upper plane extend in a direction crossing a direction in which the current lines in the lower plane extend.

In this magnetic memory, it is possible to record information selectively to a magnetoresistive device at a point of the matrix.

A layer of a high permeability material may be provided on each of the current lines. In this case, due to the presence of the high permeability layer, recording to the memory can be effectively performed.

In recording information to the magnetic memory as described above, electric currents are passed through two current lines that are positioned in the upper plane and adjacent to a selected magnetoresistive device while electric currents are passed through two current lines that are positioned in the lower plane and adjacent to the selected magnetoresistive device so that information is recorded to the selected magnetoresistive device.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS (Embodiment 1)

Figure 1:
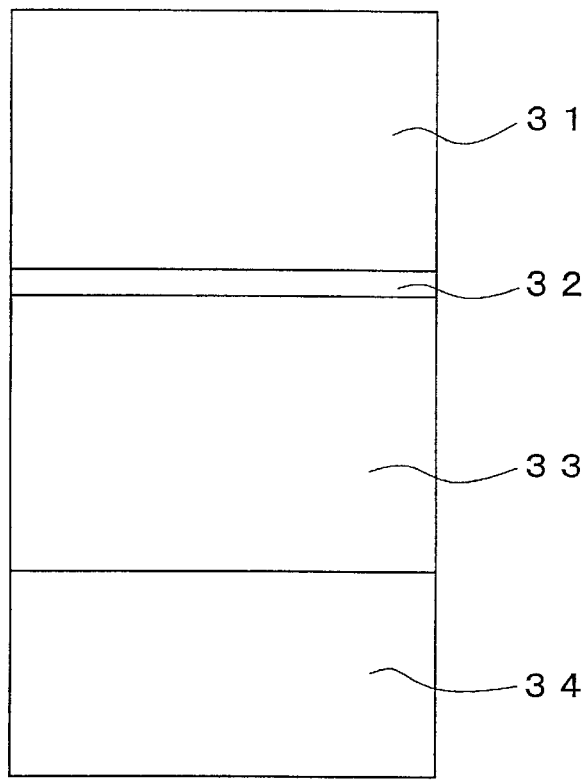
FIG. 1 schematically shows a basic structure of a TMR device according to the prior art.
Figure 2:
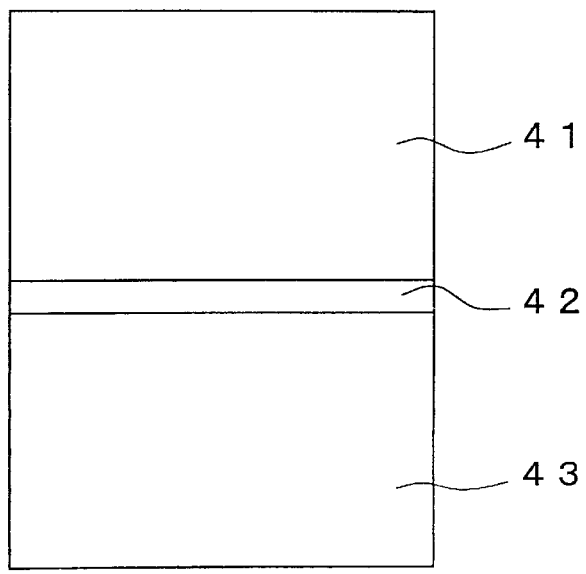
FIG. 2 schematically shows the structure of a magnetoresistive device using perpendicular magnetization according to the prior art.
Figure 3:
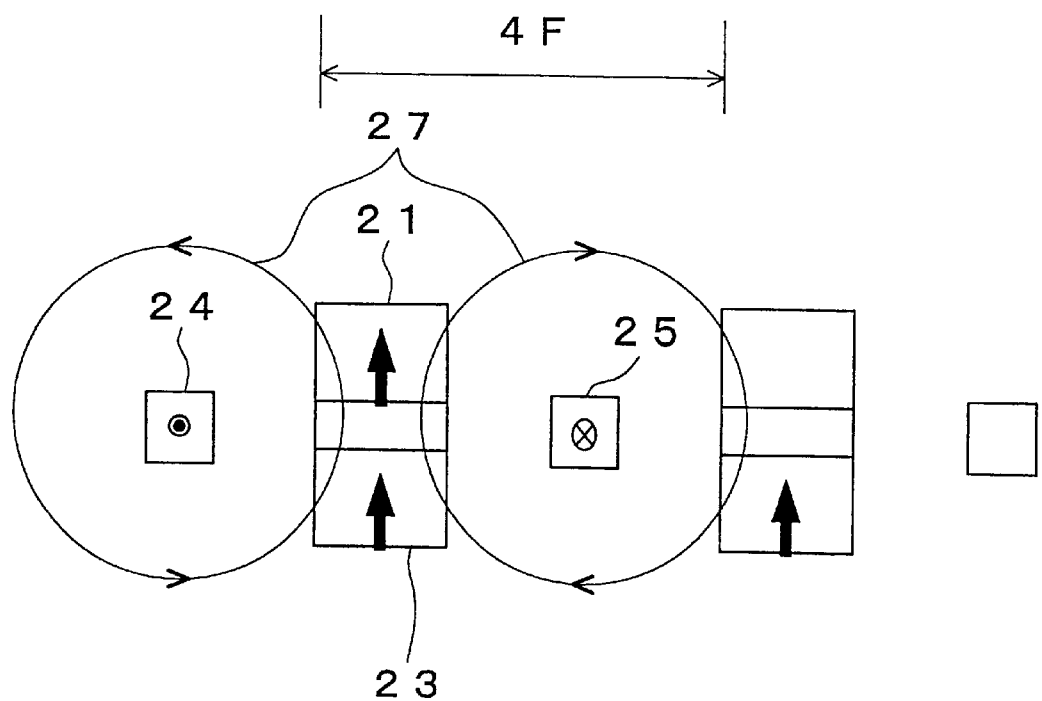
FIG. 3 is an illustration for explaining a recording method onto a magnetoresistive device according to the prior art.
Figure 4:
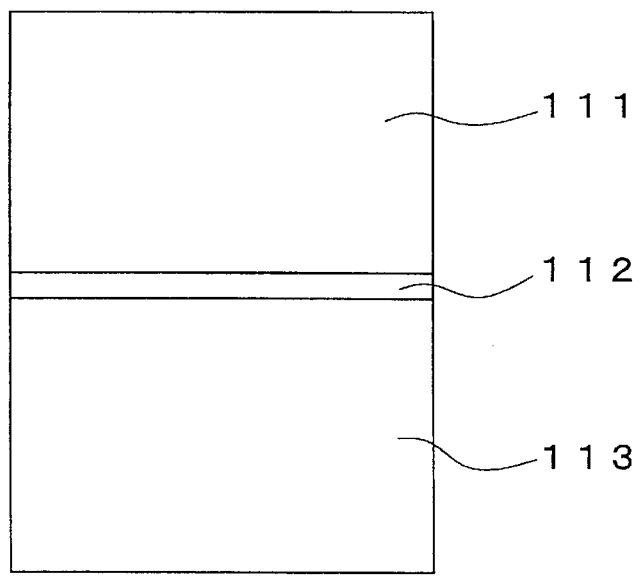
FIG. 4 schematically shows the structure of a magnetoresistive device according to a first embodiment of the present invention.

FIG. 4 schematically shows the structure of a magnetoresistive device according to the present invention. The magnetoresistive device of this embodiment has a first magnetic layer 111, a nonmagnetic layer 112 and a second magnetic layer 113. Both the first magnetic layer 111 and the second magnetic layer 113 are ferromagnetics made of a perpendicularly magnetized film of RE and iron-group TM (Transition Metal) amorphous alloy, i.e., ferrimagnets. The RM-TM material is exemplified by binary alloys (GdFe, TbFe, GdCo, TbCo, etc.) or ternary alloys (GdFeCo, TbFeCo, GdTbFe, GdTbCo, etc.).

Assuming that the first magnetic layer 111 is a memory layer, it is required that the first magnetic layer should have a coercive force Hc low enough to enable rewrite by the write magnetic field and moreover a certain level of saturation magnetization Ms and that the second magnetic layer 113 should have a small saturation magnetization Ms and a large coercive force Hc such that the influence on the first magnetic layer 111 can be reduced and that influences of external magnetic fields are kept away.

Figure 5:
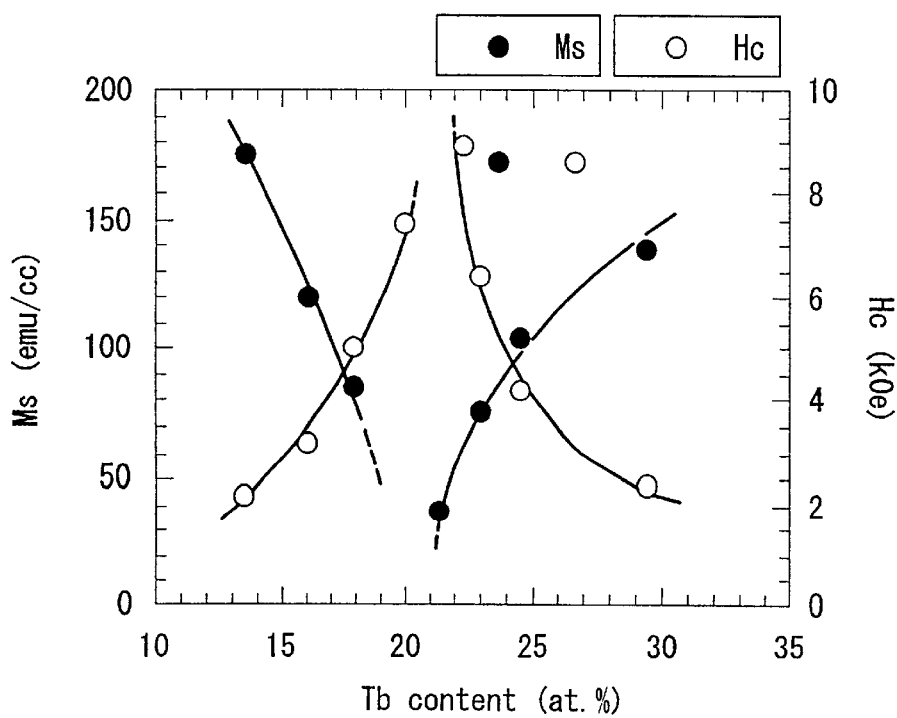
FIG. 5 is a graph showing the Tb content dependence of the saturation magnetization Ms and the coercive force Hc of TbCo alloy.

FIG. 5 shows the composition dependence of the saturation magnetization Ms and coercive force Hc at a room temperature of TbCo amorphous alloy film as an example of binary alloys of RE-TM materials. As apparent from FIG. 5, when an amorphous alloy film having a Tb content of 20–23 atomic %, i.e., an amorphous alloy film having the compensation point around the room temperature is selected as the second magnetic layer 113, the second magnetic layer 113 satisfies the above conditions. As the first magnetic layer 111, the Tb contents other than the above are suitable to satisfy the conditions.

With a composition having its compensation point around the room temperature selected as the second magnetic layer 113, the saturation magnetization Ms is almost all dissipated, and yet the magnetization of RE and TM sublattices is maintained sufficiently large by virtue of ferrimagnetism. Meanwhile, since the magnetoresistance effect could be attributed principally to TM, a sufficiently large magnetoresistance effect can be obtained even with the composition which has around the room temperature its compensation point at which the saturation magnetization Ms is dissipated.

As the nonmagnetic layer 112, either a nonmagnetic layer having electrical conductivity, such as Cu, used for conventional GMR devices or an $Al_2O_3$ film used for conventional TMR devices may be used.

However, when an oxide film is used as the nonmagnetic layer, there is a risk that the rare earth metal used in the magnetic layer may be oxidized. Therefore, it is recommended to use, as the insulative nonmagnetic layer, a nitride film of AlN, BN or the like or an insulative film having covalent bonds of diamond, DLC (Diamond-Like Carbon) or the like.

Also, as in the case of conventional GMR devices and TMR devices, the nonmagnetic layer 112, when implemented by an insulating layer, is enabled to have a larger rate of change of magnetoresistance.

The first magnetic layer 111 and the second magnetic layer 113, when too thin in film thickness, go superparamagnetic by the effect of thermal energy. Therefore, the film thickness of the magnetic layers needs to be not less than 50 Å. When those magnetic layers are too thick in film thickness, it would be difficult to fabricate micro devices. Thus, the film thickness of the magnetic layers is preferably not more than 5000 Å.

As to the nonmagnetic layer 112, in the case of a TMR device, thicknesses of the nonmagnetic layer 112 below 5 Å would cause short-circuits of the magnetic layers, while film thicknesses above 30 Å would make the electron tunneling phenomenon less likely to occur. Thus, the film thickness of the nonmagnetic layer 112 is preferably 5 Å or more, but 30 Å or less. In the case of a GMR device, on the other hand, with the increasing film thickness of the nonmagnetic layer 112, device resistance becomes too small and the rate of change of magnetoresistance also reduces. Thus, the film thickness is preferably not more than 50 Å.

Although a RE-TM alloy, which is a ferrimagnetic material, is used as the first magnetic layer 111 and the second magnetic layer 113 in the above case, it is also possible to use, as the first magnetic layer, common ferromagnetics having perpendicular magnetic anisotropy such as CoCr or CoPt.

In applications of the magnetoresistive devices to magnetic memories as memory cells, quite a large coercive force Hc would result due to the selection of a composition having its compensation point near the room temperature as the second magnetic layer 113. But, the magnetoresistive devices can easily be initialized by application of a magnetic field under heating up to near the Curie point.

(Embodiment 2)

Figure 6:
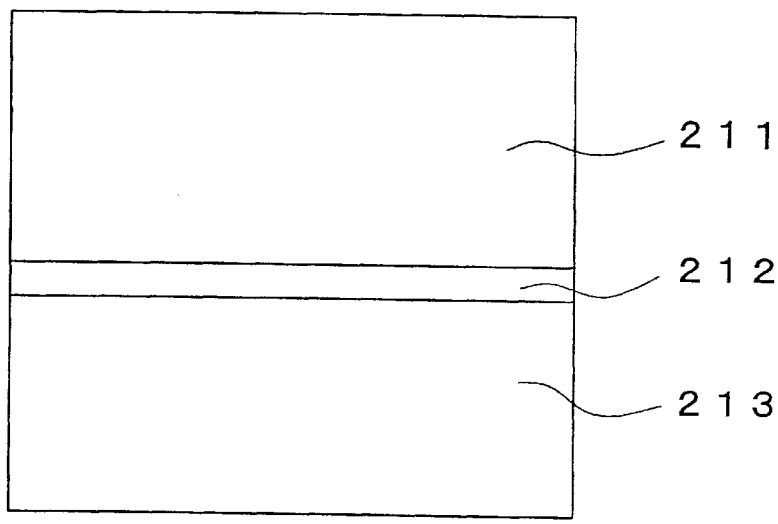
FIG. 6 schematically shows the structure of a magnetoresistive device according to a second embodiment of the invention.

FIG. 6 schematically shows the structure of a magnetoresistive device according to Embodiment 2 of the invention. Referring to FIG. 6, the magnetoresistive device of the embodiment is essentially made up of a first magnetic layer 211, a nonmagnetic layer 212 and a second magnetic layer 213. Both the first magnetic layer 211 and the second magnetic layer 213 are made of a perpendicularly magnetized film of RE and iron-group TM amorphous alloys.

Assuming that the first magnetic layer 211 is a memory layer, the first magnetic layer 211 should have a coercive force Hc low enough to enable rewrite by the write magnetic field, and a magnetic anisotropy energy of a magnitude enough to keep the perpendicular magnetic anisotropy. The second magnetic layer 113 preferably has a small saturation magnetization Ms and a large coercive force Hc such that the influence of the second magnetic layer on the first magnetic layer 211 can be reduced and that the second magnetic layer is not affected by external magnetic fields.

Materials of the first magnetic layer 211 will be discussed below.

First, crystalline materials are discussed by taking CoCr-based alloys as an example. The Journal of the Applied Magnetism Society of Japan, Vol. 24, No. 1, pp. 25–33 (2000), shows the Ta content dependence (Ta content: 0–10 atomic %) of each of the saturation magnetization Ms, coercive force Hc and perpendicular magnetic anisotropy energy $K\perp$ of a single-layer film of CoCrTa as an example of CoCr-based alloys. According to this article, whereas the CoCrTa film maintains the perpendicular magnetic anisotropy within the above composition range, the coercive force Hc shows as large values as about 800–24,000 e.

The perpendicular magnetic anisotropy energy $K\perp$ and the coercive force Hc show similar tendencies. As the perpendicular magnetic anisotropy energy $K\perp$ increases, the coercive force Hc tends to also increase. On the other hand, as the coercive force Hc goes smaller, the perpendicular magnetic anisotropy energy $K\perp$ also goes smaller.

Next, RE-TM amorphous alloys containing a heavy rare earth are discussed by taking TbCo alloy as an example. The Journal of the Applied Magnetism Society of Japan, Vol. 10, No. 2, pp. 179–182 (1986), show Tb content dependences of the saturation magnetization Ms, coercive force Hc and magnetic anisotropy energy Ku of a TbCo single-layer film. According to this article, whereas the Tb content at which the TbCo alloy becomes a perpendicularly magnetized film is 13–31 atomic %, the coercive force within the Tb content range in which the TbCo alloy maintains the perpendicular magnetic anisotropy is as large as 3 kOe and over.

As described above, with a perpendicularly magnetized film made of a crystalline alloy, such as CoCr, or of a RE-TM amorphous alloy containing a heavy rare earth element, such as TbCo, the coercive force Hc would inevitably become too large in order to maintain a perpendicular magnetic anisotropy energy $K\perp$ appropriate for the memory layer of the invention. Meanwhile, in order that a desired coercive force Hc is reached, the perpendicular magnetic anisotropy energy $K\perp$ would inevitably be decreased as well, so that the perpendicular magnetic anisotropy could not be satisfied.

Figure 7:
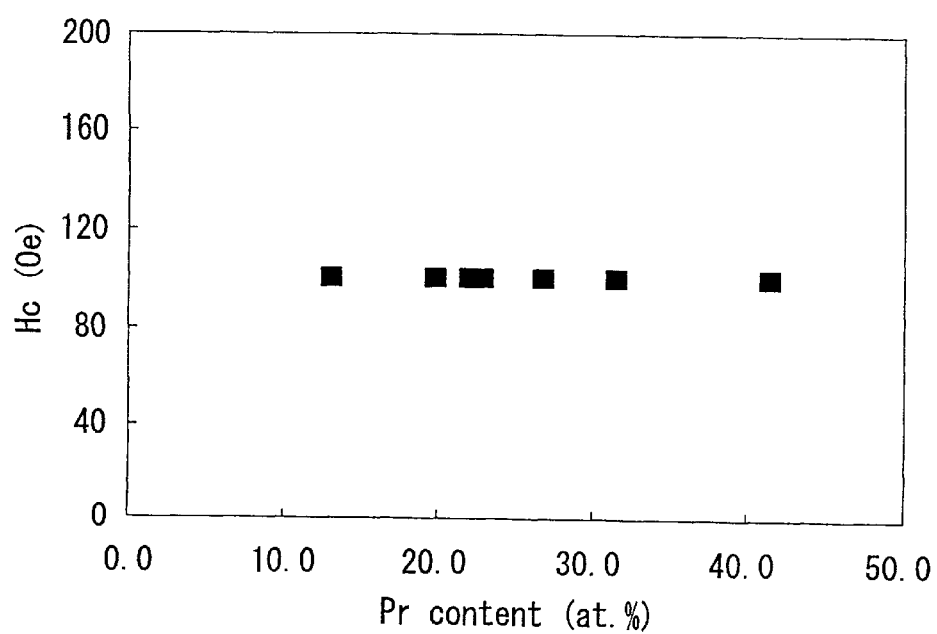
FIG. 7 is a graph showing the Pr content dependence of the coercive force Hc of PrCo alloy.
Figure 8:
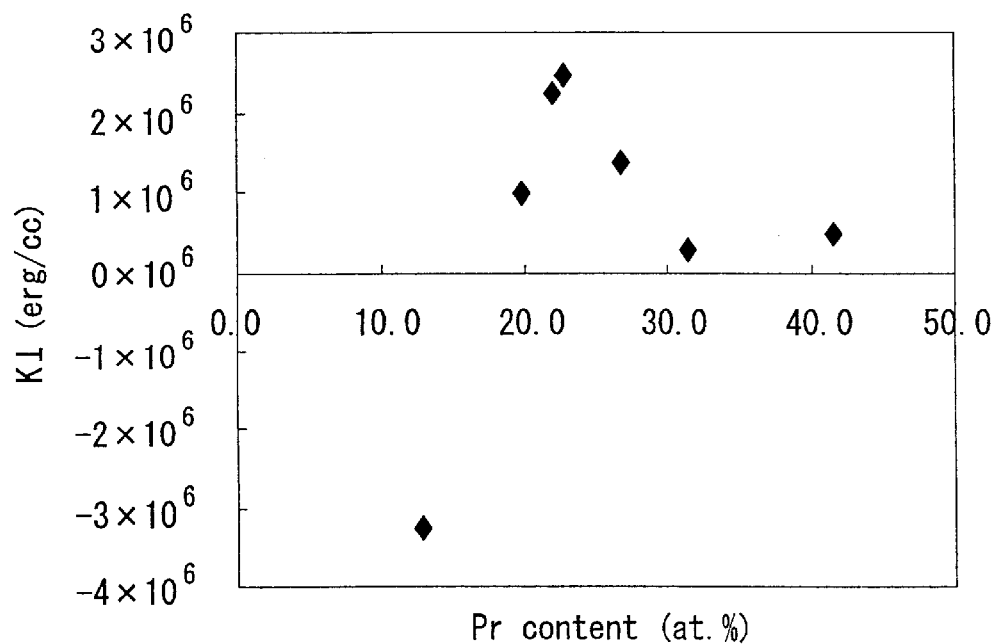
FIG. 8 is a graph showing the Pr content dependence of the perpendicular magnetic anisotropy energy K⊥ of PrCo alloy.

Next, RE-TM amorphous alloys containing light rare earth metals are discussed by taking PrCo amorphous alloy and TbPrCo amorphous alloy as an example. FIG. 7 shows the composition dependence of the coercive force Hc at a room temperature of a PrCo amorphous alloy film. The coercive force Hc of the PrCo amorphous alloy film, being scarcely dependent on the Pr content, is around 100 Oe, which is a value permitting magnetization reversal fully by a recording current magnetic field in a magnetic memory. FIG. 8 shows the Pr content dependence of the perpendicular magnetic anisotropy energy $K\perp$ at the room temperature of the PrCo amorphous alloy film. The perpendicular magnetic anisotropy energy $K\perp$ has a value resulting from subtracting the diamagnetic field energy, $2\pi Ms^2$, from the perpendicular magnetic anisotropy energy, Ku, proper to the PrCo amorphous alloy film. When the perpendicular magnetic anisotropy energy $K\perp$ takes a positive value, the resulting magnetization of PrCo amorphous alloy film becomes stable in the perpendicular direction. Accordingly, it can be understood that a perpendicularly magnetized film results with the Pr content being about 20 atomic % or higher, and that particularly with the Pr content falling in a range of about 20–30 atomic %, a large perpendicular magnetic anisotropy energy $K\perp$ can be obtained, resulting in a stable perpendicularly magnetized film.

Figure 9:
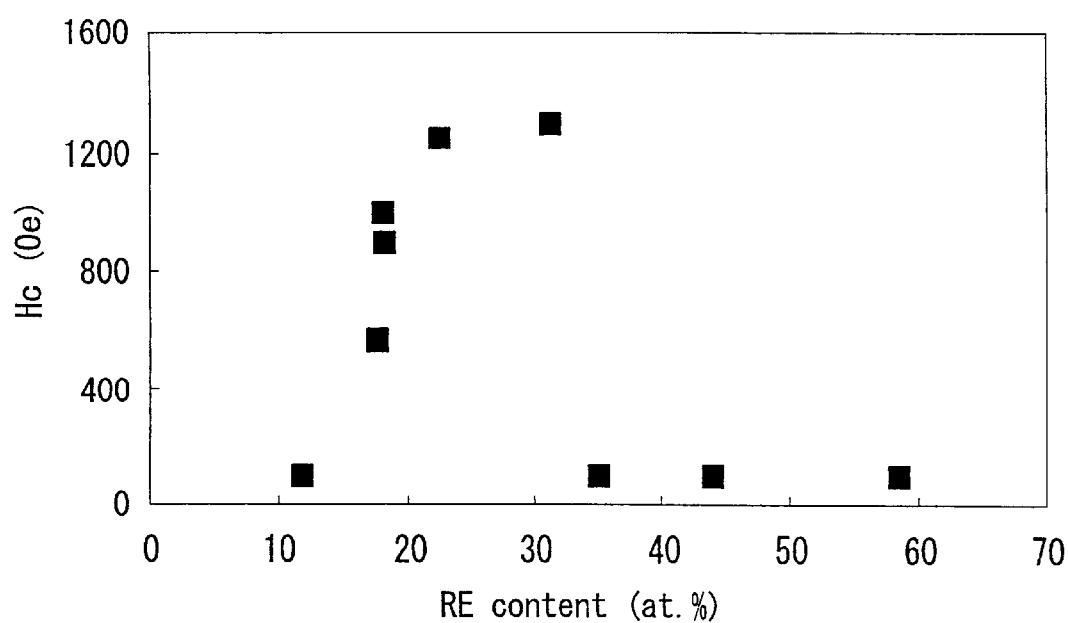
FIG. 9 is a graph showing the RE (Rare Earth) content dependence of the coercive force Hc of TbPrCo alloy.
Figure 10:
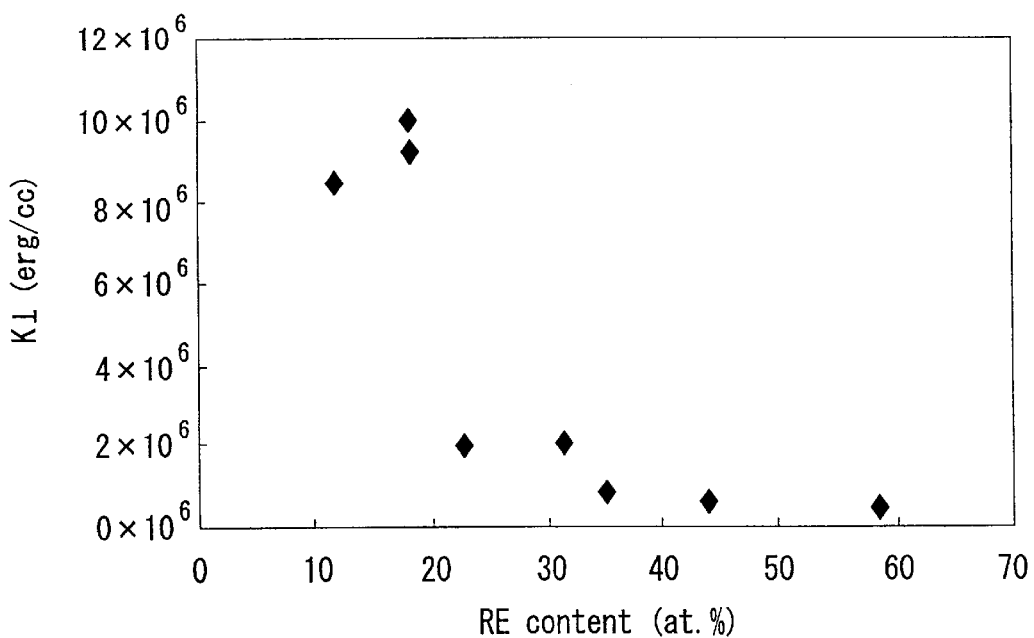
FIG. 10 is a graph showing the RE content dependence of the perpendicular magnetic anisotropy energy K⊥ of TbPrCo alloy.

FIG. 9 shows the RE content dependence of the coercive force Hc of a TbPrCo amorphous alloy film at a room temperature. FIG. 10 shows the RE content dependence of the perpendicular magnetic anisotropy energy $K\perp$ at the room temperature of the TbPrCo amorphous alloy film. It is noted that the relative composition ratio of Tb to Pr in the rare earth (RE) content is nearly Tb:Pr=1:1. For the first magnetic layer 211, which is required to have a coercive force Hc small enough to reverse the magnetization by a recording current magnetic field in a magnetic memory, it is obvious from FIG. 9 that the RE content should be 15 atomic % or more, but 35 atomic % or less. On the other hand, it can also be understood that the perpendicular magnetic anisotropy energy $K\perp$ shows a positive value at all of the RE contents shown in FIG. 10, and that a stable perpendicularly magnetized film is provided by the RE content range of 10–30 atomic % in particular.

Therefore, materials suitable for the first magnetic layer 211 are exemplified by binary alloys (PrFe, PrCo, etc.) or ternary alloys (PrGdFe, PrGdCo, PrTbFe, PrTbCo, PrFeCo etc.) containing at least a light rare earth metal such as Pr.

Meanwhile, it is known that containing a heavy rare earth metal would cause the coercive force to increase. Therefore, materials suitable for the second magnetic layer 213 are exemplified by binary alloys (TbFe, TbCo, GdFe, GdCo, etc.) or ternary alloys (GdTbFe, GdTbCo, TbFeCo, etc.) containing principally a heavy rare earth metals, such as Tb, Gd, as the rare earth metal.

Particularly for the second magnetic layer 213, since a magnetic field generator such as electromagnets can be used for initialization, both the coercive force Hc and the perpendicular magnetic anisotropy energy $K\perp$ are, desirably, as large as possible from the viewpoint of stability. Accordingly, it can be understood from FIGS. 9 and 10 that TbPrCo amorphous alloy film, when used, preferably should have a RE content of 13–32 atomic %.

It is noted that when a RE-TM material having a composition whose compensation point is around the room temperature is selected as the second magnetic layer 213, the saturation magnetization Ms is almost all dissipated, by which the effect on the first magnetic layer 211 can be avoided. Further, the magnetization of RE and TM sublattices is maintained sufficiently large by virtue of ferrimagnetism of the RE-TM alloy material. Since the magnetoresistance effect could be attributed principally to TM, a sufficiently large magnetoresistance effect can be obtained even with the composition having around the room temperature its compensation point at which the saturation magnetization Ms is dissipated.

In application of the magnetoresistive devices to a magnetic memory as memory cells, quite a large coercive force Hc would result due to the selection of a composition whose compensation point is around the room temperature as the second magnetic layer 213. However, the memory can easily be initialized by applying a magnetic field while heating up to near the Curie point.

As the nonmagnetic layer 212, either a nonmagnetic layer having electrical conductivity, such as Cu, used for conventional GMR devices or an insulating nonmagnetic layer such as an $Al_2O_3$ film used for conventional TMR devices may be used.

However, when an oxide film is used as the nonmagnetic layer, there is a risk that the rare earth metal used in the magnetic layer may be oxidized. Therefore, it is preferred to use, as the insulating nonmagnetic layer, a nitride film of AlN, BN or the like or an insulative film having covalent bonds of diamond, DLC or the like.

The first magnetic layer 211 and the second magnetic layer 213, when too thin in film thickness, go superparamagnetic by the effect of thermal energy. Therefore, the film thickness of the magnetic layers needs to be not less than 50 Å. When those magnetic layers are too thick in film thickness, it would be difficult to fabricate micro devices. Thus, the film thickness of the magnetic layers is preferably not more than 5000 Å.

As to the nonmagnetic layer 212, in the case of a TMR device, thicknesses of the nonmagnetic layer 212 below 5 Å would cause short-circuits of the magnetic layers, while film thicknesses above 30 Å would make the electron tunneling phenomenon less likely to occur. Thus, the film thickness of the nonmagnetic layer 212 is preferably 5 Å or more, but 30 Å or less. In the case of a GMR device, on the other hand, with the increasing film thickness of the nonmagnetic layer 112, device resistance becomes too small and the rate of change of magnetoresistance also reduces. Thus, the film thickness is preferably not more than 50 Å.

The material of the second magnetic layer 213 is not limited to the RE-TM alloy materials of this embodiment, and apparently other materials may also be used.

(Embodiment 3)

Figure 11:
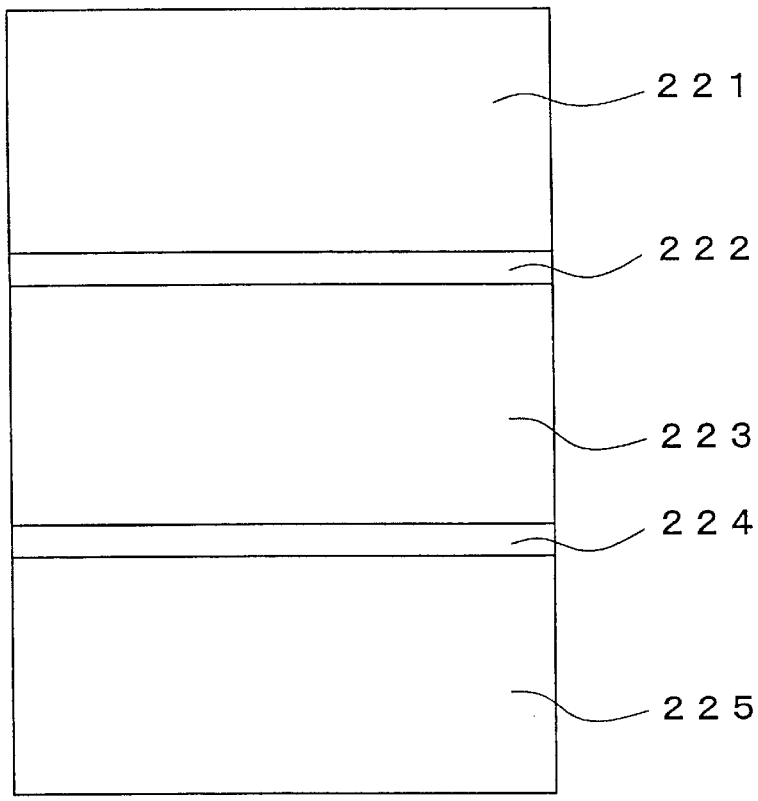
FIG. 11 schematically shows the structure of a magnetoresistive device according to a third embodiment of the invention.

FIG. 11 schematically shows the structure of a magnetoresistive device according to Embodiment 3 of the invention. Referring to FIG. 11, the magnetoresistive device of the embodiment is essentially made up of a first magnetic layer 221, a first nonmagnetic layer 222, a second magnetic layer 223, a second nonmagnetic layer 224 and a third magnetic layer 225. All of the first magnetic layer 221, the second magnetic layer 223 and the third magnetic layer 225 are made of a perpendicularly magnetized film of an RE and iron-group TM amorphous alloy, i.e., a ferrimagnetic.

Assuming that the second magnetic layer 223 is a memory layer, it is required that the second magnetic layer 223 should have such a coercive force Hc low enough to enable rewrite by the write magnetic field, and a perpendicular magnetic anisotropy energy $K\perp$ of such a level as to enable the holding of perpendicular magnetic anisotropy. The first magnetic layer 221 and the third magnetic layer 225, on the other hand, desirably have a small saturation magnetization Ms and a large coercive force Hc that their influences on the second magnetic layer 223 can be reduced and, at the same time, that the layers 221 and 225 are not affected by external magnetic fields.

Therefore, as described also in Embodiment 2, materials suitable for the second magnetic layer 223, which serves as a memory layer, are exemplified by binary alloys (PrFe, PrCo, etc.) or ternary alloys (PrGdFe, PrGdCo, PrTbFe, PrTbCo, PrFeCo etc.) containing at least a light rare earth metal such as Pr as the rare earth metal. Also, materials suitable for the first magnetic layer 221 and the third magnetic layer 225 are exemplified by binary alloys (TbFe, TbCo, GdFe, GdCo, etc.) or ternary alloys (GdTbFe, GdTbCo, PrTbCo, TbFeCo, etc.) containing principally a heavy rare earth metal, such as Tb, Gd, as the rare earth metal.

The following will describe a case in which PrCo amorphous alloy is used as the second magnetic layer 223 and a case in which PrTbCo amorphous alloy is used as the second magnetic layer 223.

Figure 12:
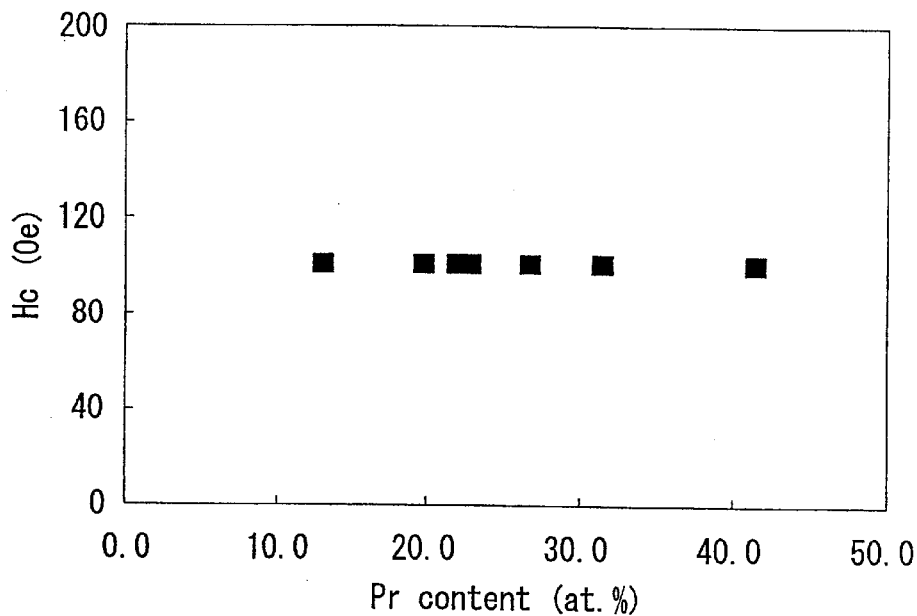
FIG. 12 is a graph showing the Pr content dependence of the coercive force Hc of PrCo alloy.
Figure 13:
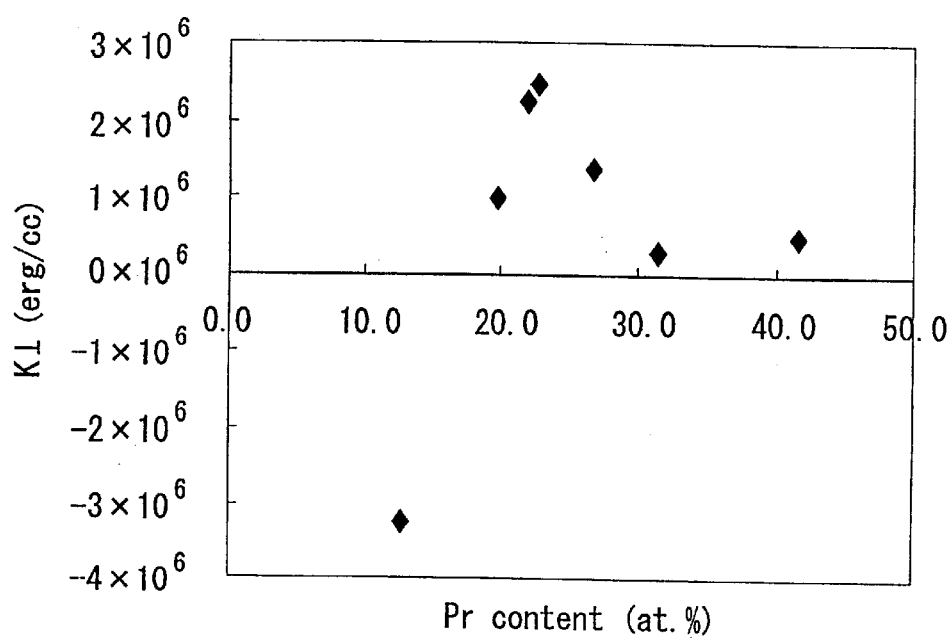
FIG. 13 is a graph showing the Pr content dependence of the perpendicular magnetic anisotropy energy K⊥ of PrCo alloy.

FIG. 12 shows the composition dependence of the coercive force Hc of a PrCo amorphous alloy film. The PrCo amorphous alloy film exhibits a coercive force Hc of constantly around 100 Oe at all of the Pr contents, which indicates that the PrCo amorphous alloy film can be reversed in magnetization by a magnetic field resulting from the recording current. FIG. 13 shows the Pr content dependence of the perpendicular magnetic anisotropy energy $K\perp$ of the PrCo amorphous alloy film at a room temperature. The perpendicular magnetic anisotropy energy $K\perp$ has a value resulting from subtracting the diamagnetic field energy, $2\pi Ms^2$, from the perpendicular magnetic anisotropy energy, Ku, proper to the PrCo amorphous alloy film. When the perpendicular magnetic anisotropy energy $K\perp$ takes a positive value, the resulting magnetization of PrCo amorphous alloy film becomes stable in the perpendicular or vertical direction. Accordingly, it can be understood that with the Pr content being about 20 atomic % or higher, a perpendicularly magnetized film results, and that particularly with the Pr content falling in a range of about 20–30 atomic %, a large perpendicular magnetic anisotropy energy $K\perp$ can be obtained, resulting in a stable perpendicularly magnetized film.

Figure 14:
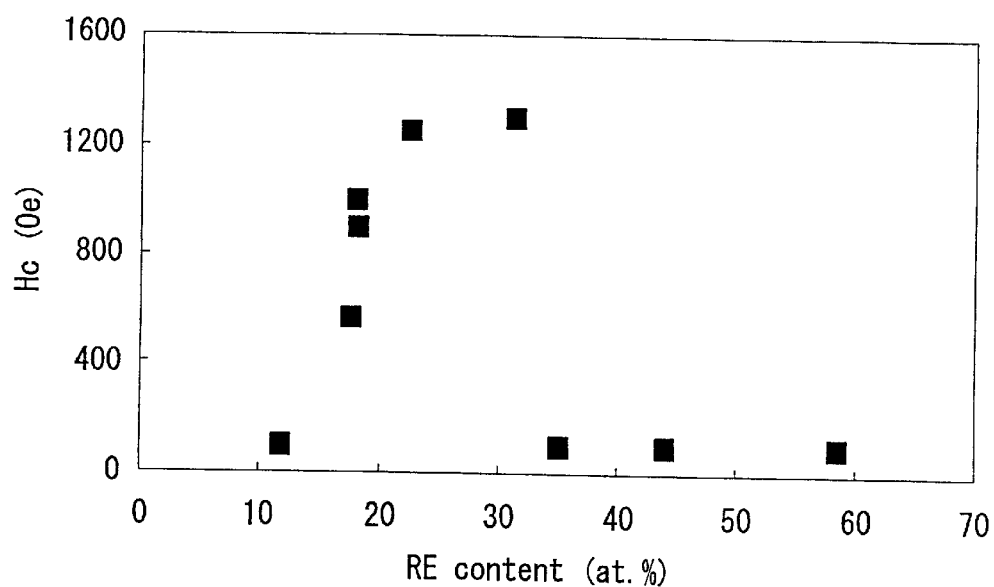
FIG. 14 is a graph showing the RE content dependence of the coercive force Hc of TbPrCo alloy.
Figure 15:
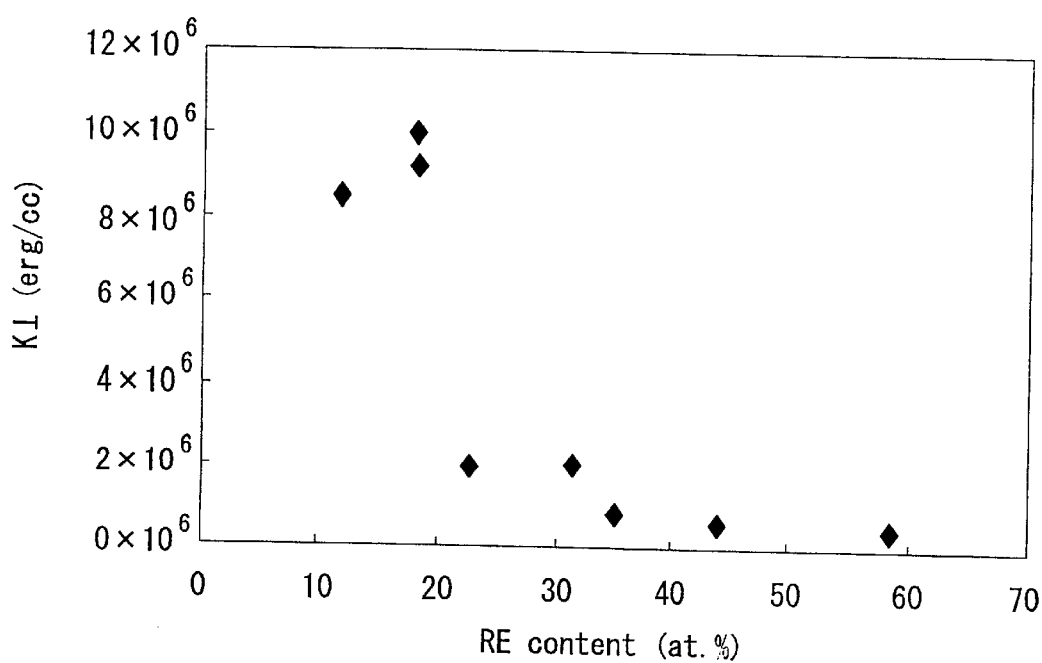
FIG. 15 is a graph showing the RE content dependence of the perpendicular magnetic anisotropy energy K⊥ of TbPrCo alloy.

FIG. 14 shows the RE content dependence at room temperature of coercive force Hc of a PrTbCo amorphous alloy. FIG. 15 shows the RE content dependence at room temperature of perpendicular magnetic anisotropy energy K⊥ of PrTbCo amorphous alloy. It can be seen from FIG. 14 that if a level of coercive force Hc that does not allow the magnetization reversal of the magnetic layer against external magnetic fields is 800 Oe, then the RE content satisfying the above condition is 18–33 atomic %. On the other hand, it can also be understood from FIG. 15 that the perpendicular magnetic anisotropy energy K⊥ shows a positive value at all points in the RE content range shown in FIG. 15, and that a stable perpendicularly magnetized film is provided by the RE content range of 10–30 atomic % in particular.

Further, in order to reduce the effects of magnetostatic leakage fields from a high coercive force material (first magnetic layer 221 and third magnetic layer 225) to a low coercive force material (second magnetic layer 223), RE-TM materials having a compensation point around the room temperature may also be used as the first magnetic layer 221 and the third magnetic layer 225. In this case, the saturation magnetization Ms is almost all dissipated at around the compensation point, but the magnetization of RE and TM sublattices is maintained sufficiently large by virtue of ferrimagnetism of the material. Also, since the magnetoresistance effect could be attributed principally to TM, a sufficiently large magnetoresistance effect can be obtained even with a composition having around the room temperature its compensation point at which the saturation magnetization Ms is dissipated.

In the case where a composition whose compensation point is around the room temperature is selected for the first and third magnetic layers, quite a large coercive force Hc would result. However, the magnetoresistive devices can easily be initialized by application of a magnetic field while heating up to near the Curie point.

As the nonmagnetic layers, either a nonmagnetic layer having electrical conductivity, such as Cu, used for conventional GMR devices or an insulating film, such as an $Al_2O_3$ film, used for conventional TMR devices may be used. However, if an insulating layer is used as the first and second nonmagnetic layers, a larger rate of change of magnetoresistance can be obtained.

Although RE-TM alloy, which is a ferrimagnetic, is used as a material of the magnetic layers in the above case, it is also possible to use common ferromagnetics having perpendicular magnetic anisotropy such as CoCr and CoPt.

For the magnetoresistive device having the above structure, it is still also possible to use ferrimagnetics having different coercive forces as the first, second and third magnetic layers. In this case, a multi-valued memory can be implemented.

The magnetoresistive device of Embodiment 3 is capable of obtaining an MR ratio about twice higher than the magnetoresistive device of Embodiment 2.

(Embodiment 4)

Figure 16:
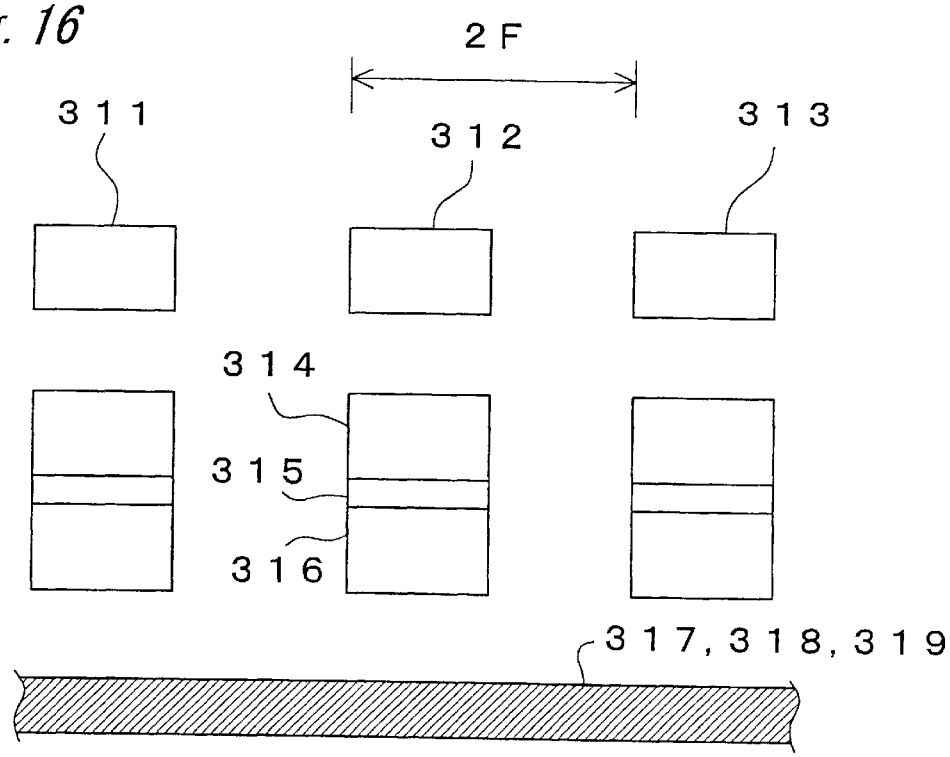
FIG. 16 schematically shows the structure of a magnetic memory according to a fourth embodiment of the invention.

FIG. 16 schematically shows the structure of a magnetic memory according to Embodiment 4 of the invention. The magnetic memory of this embodiment has a structure that electric current lines 311–313, 317–319 for use of recording are placed above and below magnetoresistive devices, where each device is essentially made up of a first magnetic layer 314, a nonmagnetic layer 315 and a second magnetic layer 316.

Figure 17:
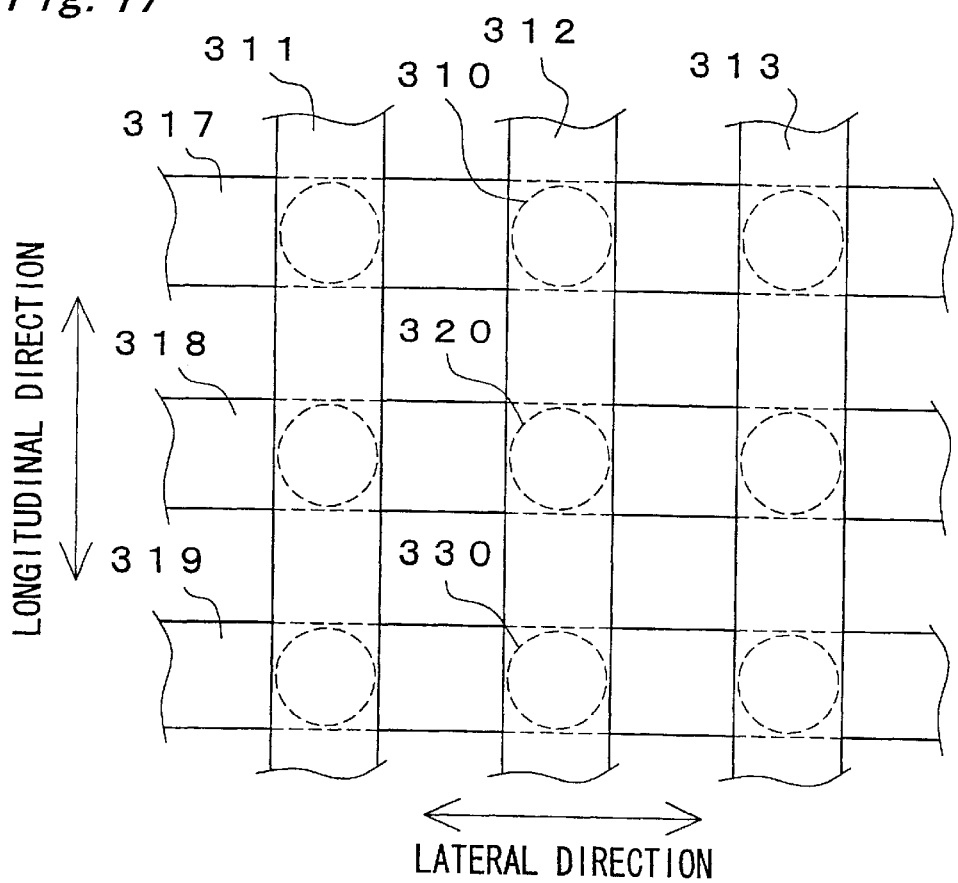
FIG. 17 is a view showing the arrangement of magnetoresistive devices and current lines in the fourth embodiment.

The magnetoresistive devices as well as the placement of the current lines will be explained with reference to FIG. 17. Referring to FIG. 17, the current lines 311, 312, 313 are placed above the devices, and the current lines 317, 318, 319 are placed below the devices. Information recording is done by using these current lines. For example, when recording information to a device 320, electric currents are passed through the current lines 311, 313 placed above the laterally adjacent devices and the current lines 317, 319 placed below the longitudinally adjacent devices 310, 330, whereby recording of the information to the memory layer of the device 320 is performed by the resultant of magnetic fields generated from these current lines. It is noted that the device is fabricated into a cylindrical configuration taking the stability of recording magnetization into consideration.

With this structure, since the current lines are present in planes different from that of the device, the distance between adjoining devices is 2F with the use of wiring rule F. Whereas the device-to-device distance would be 4F in the prior art, the structure of this embodiment is capable of higher integration, compared with the prior art.

The current lines 311–313, 317–319 are made of electrically conductive nonmagnetic material such as Al and Cu. Both the first magnetic layer 314 and the second magnetic layer 316 are made of a perpendicularly magnetized film of RE (rare earth element)-TM (transition metal) amorphous alloy, or a perpendicularly magnetized film of CoCr-based alloy or other crystalline alloys.

Assuming that the first magnetic layer 314 is a memory layer, the first magnetic layer 314 should have a coercive force Hc low enough to enable magnetization reversal by the write current lines, and also should maintain the perpendicular magnetic anisotropy. Materials of the first magnetic layer 314 satisfying these conditions are exemplified by binary alloys (PrFe, PrCo, etc.) or ternary alloys (PrGdFe, PrGdCo, PrTbFe, PrTbCo, PrFeCo etc.) containing at least a light rare earth metal such as Pr.

Meanwhile, the second magnetic layer 316 is required to, while maintaining the perpendicular magnetic anisotropy, have such a level of coercive force as not to cause the magnetization reversal by a magnetic field generated in writing. Materials suitable for the second magnetic layer 316 satisfying these characteristics are exemplified by binary alloys (TbFe, TbCo, GdFe, GdCo, etc.) or ternary alloys (GdTbFe, GdTbCo, TbFeCo, etc.) containing principally heavy rare earth metals such as Tb and Gd as the rare earth metal, or further by common ferromagnetics having perpendicular magnetic anisotropy such as CoCr and CoPt.

The first magnetic layer and the second magnetic layer, when too thin in film thickness, go superparamagnetic by the effect of thermal energy. Therefore, the film thickness of the magnetic layers needs to be not less than 50 Å. When those magnetic layers are too thick in film thickness, it would be difficult to fabricate micro devices. Thus, the film thickness of the magnetic layers is preferably not more than 5000 Å.

For the nonmagnetic layer 315, either a nonmagnetic material having electrical conductivity, such as Cu, used for conventional GMR devices or an $Al_2O_3$ film used for TMR devices may be used. However, with consideration given to the risk that the rare earth metals of the magnetic layer may be oxidized, it is desirable to use, as a material of the insulating nonmagnetic layer, a nitride film of AlN, BN or the like or a film having covalent bonds of Si, diamond, DLC or the like.

As to the film thickness of the nonmagnetic layer, in the case of a TMR device, film thicknesses below 5 Å would cause short-circuits of the magnetic layers, while film thicknesses above 30 Å would make the electron tunneling phenomenon less likely to occur. Thus, the film thickness of the nonmagnetic layer is preferably 5 Å or more, but 30 Å or less. In the case of a GMR device, on the other hand, with the increasing film thickness of the nonmagnetic layer, device resistance becomes too small and the rate of change of magnetoresistance also reduces. Thus, the film thickness is preferably not more than 50 Å.

It is noted that although not shown, the current lines and the devices are insulated from each other by means of insulating nonmagnetic material such as $SiO_2$.

Next, details of the method of recording to a point of intersection in the device array pattern will be explained with reference to FIGS. 18A and 18B.

Figure 18A:
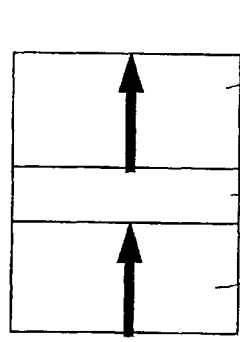
FIGS. 18A and 18B are views showing magnetized states for a "0" and a "1," respectively, in the magnetoresistive device.
Figure 18B:
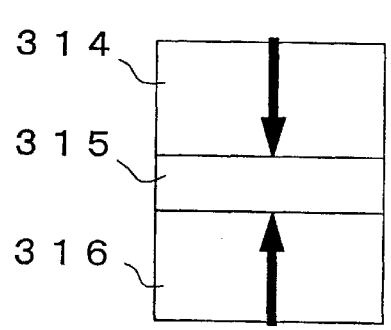

As shown in FIGS. 18A and 18B, assuming that the first magnetic layer 314 is a memory layer, magnetization information of "0" or "1" is recorded in correspondence to whether the first magnetic layer 314 is magnetized upward (FIG. 18A) or downward (FIG. 18B). Recording to a magnetoresistive device of this invention is done using the resultant of magnetic fields generated by passing electric currents through the current lines placed above the laterally adjacent devices and below the longitudinally adjacent devices.

Figure 19:
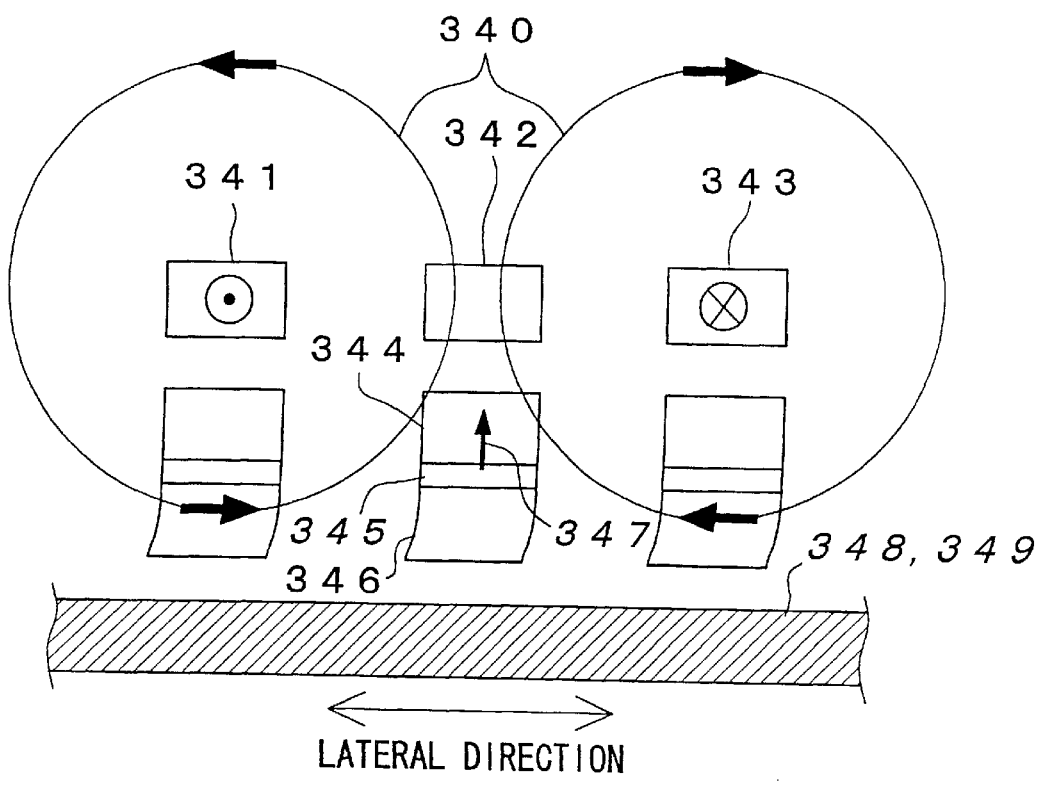
FIG. 19 is an illustration for explaining a recording method of the fourth embodiment.
Figure 20:
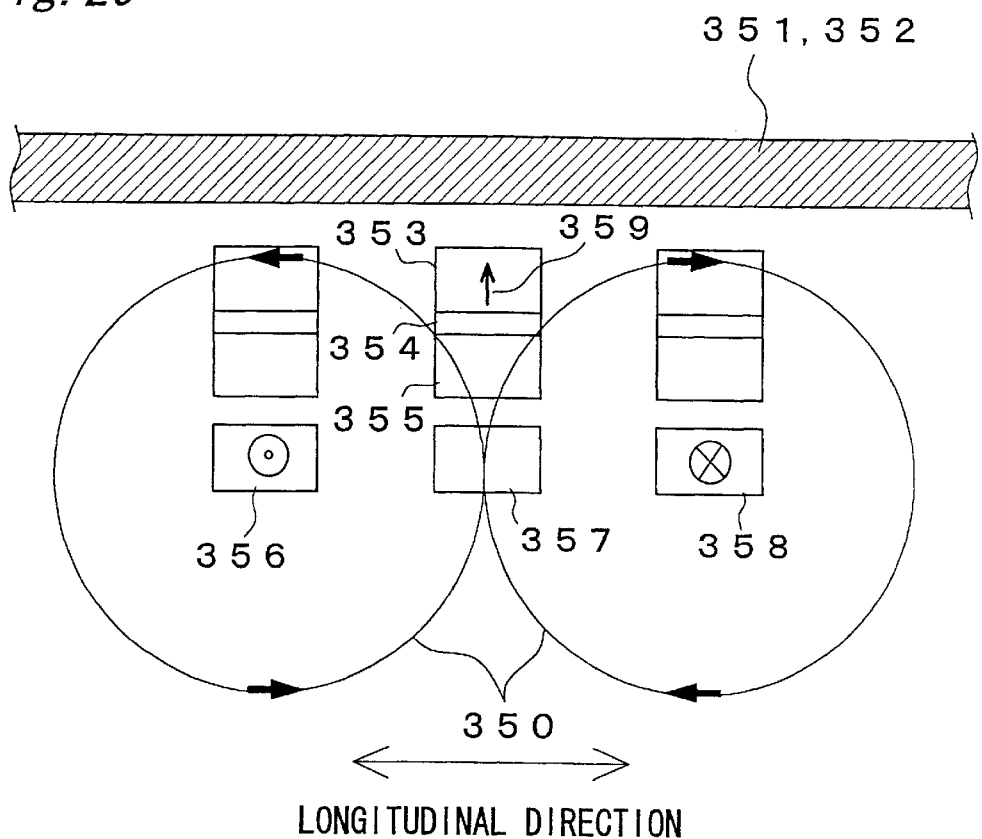
FIG. 20 is an illustration for explaining a recording method of the fourth embodiment.

FIGS. 19 and 20 are sectional views showing devices arranged in the lateral direction and in the longitudinal direction, respectively, with a device to be recorded at the center. In this embodiment, recording is done by reversing the magnetization of the memory layer upward of the device.

Referring to FIG. 19, recording to a memory layer 344 is done by using the resultant of magnetic fields generated from current lines 341, 343 placed above the devices adjacent in the lateral direction to the device to be recorded. In this case, currents are passed through the current lines 341, 343 in directions opposite to each other. In this embodiment, since information recording is done by reversing a magnetization direction 347 of the memory layer 344 of the device, currents are passed through the current line 341 frontward of the drawing sheet and through the current line 343 backward of the drawing sheet. However, the magnetization direction 347 of the memory layer 344 is not reversed only by using magnetic fields 340 from the upper current lines 341, 343 alone. Thus, electric current is passed through the lower current lines 348 and 349 as well, to generate magnetic fields. Eventually, the recording is done by using the resultant of the magnetic fields generated from the upper and lower four current lines. It is noted that current lines 348, 349 are placed below devices aligned frontward and backward of the drawing sheet with respect to the device to be recorded, respectively. In FIG. 19, reference numeral 342 indicates a current line, and reference numerals 345 and 346 indicate a non-magnetic layer and the other magnetic layer, respectively.

FIG. 20 shows a state in which currents are passed through current lines placed below the devices. With currents passed through a current line 356 frontward of the drawing sheet and through a current line 358 backward of the drawing sheet, the resultant magnetic field is directed upward of the device (see arrow 359). Current lines 351, 352 are placed above devices located laterally adjacent to the device to be recorded. In FIG. 20, reference numeral 350 indicates a magnetic field generated, reference numerals 354 and 355 indicate a non-magnetic layer and the other magnetic layer, respectively, and reference numeral 357 indicates a current line.

Thus, the magnetization of the memory layer can be reversed upward of the device by using at a recording point a resultant of magnetic fields generated from totally four upper and lower current lines as shown in FIGS. 19 and 20.

The magnetoresistive device, to which recording has been done in this way, shows a low resistance value when the magnetization of the first magnetic layer and the magnetization of the second magnetic layer are parallel to each other, and a high resistance value when those magnetizations are antiparallel from each other, as described above. Thus, the magnetoresistive device is distinguishable between the two recording states.

The write current lines, which are insulated from the devices in Embodiment 4, may be used also for reading recorded information when used in magnetic memories. Alternatively, read current lines may be additionally provided to the structure of Embodiment 4.

The devices may be fabricated above transistors to constitute a magnetic memory, in which case one side of the devices has to be connected to a transistor. In this case, current lines serving for both recording and reading may be connected to the other side of the devices, or additional current lines for reading may be added to the structure of Embodiment 4.

(Embodiment 5)

Figure 21:
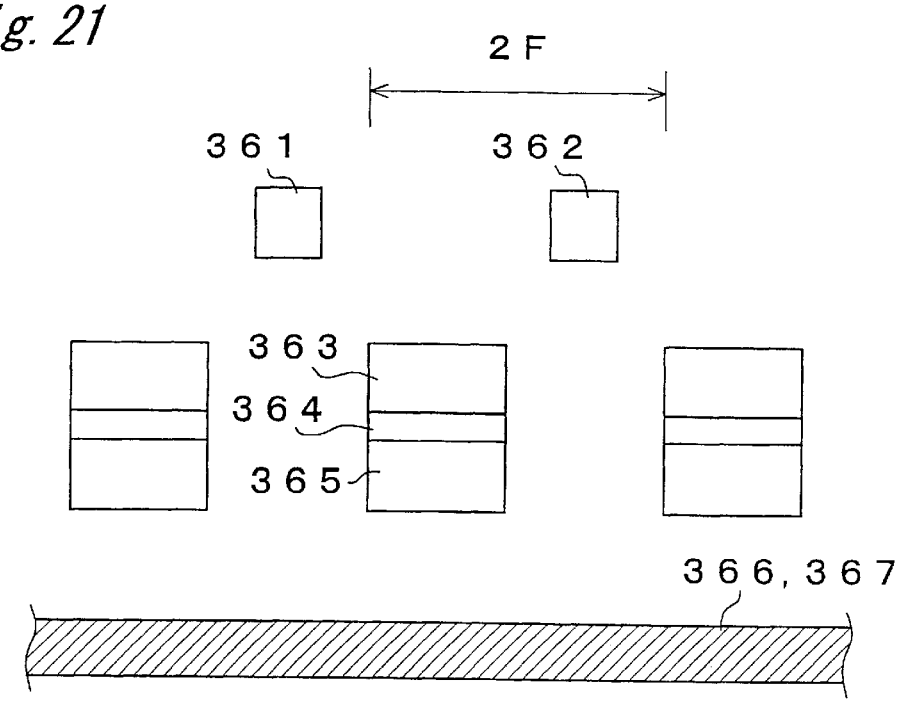
FIG. 21 schematically shows the structure of a magnetic memory according to a fifth embodiment of the invention.

FIG. 21 schematically shows the structure of a magnetic memory according to Embodiment 5. In the magnetic memory of this embodiment, information is recorded to a magnetoresistive device using magnetic fields which are generated by passing electric currents through the recording current lines placed obliquely above and obliquely below the device.

First, the structure of the magnetoresistive device is explained. The magnetoresistive device is essentially made up of a first magnetic layer 363, a nonmagnetic layer 364, and a second magnetic layer 365. Current lines 361, 362 are placed obliquely above the device, while current lines 366, 367 are placed obliquely below the device. The lower current lines 366 and 367 are placed between a line of the devices shown in the figure and another line of the device positioned on a side forward of the drawing sheet, and between the line of the devices shown in the figure and another line of the device positioned on a side backward of the drawing sheet.

Figure 22:
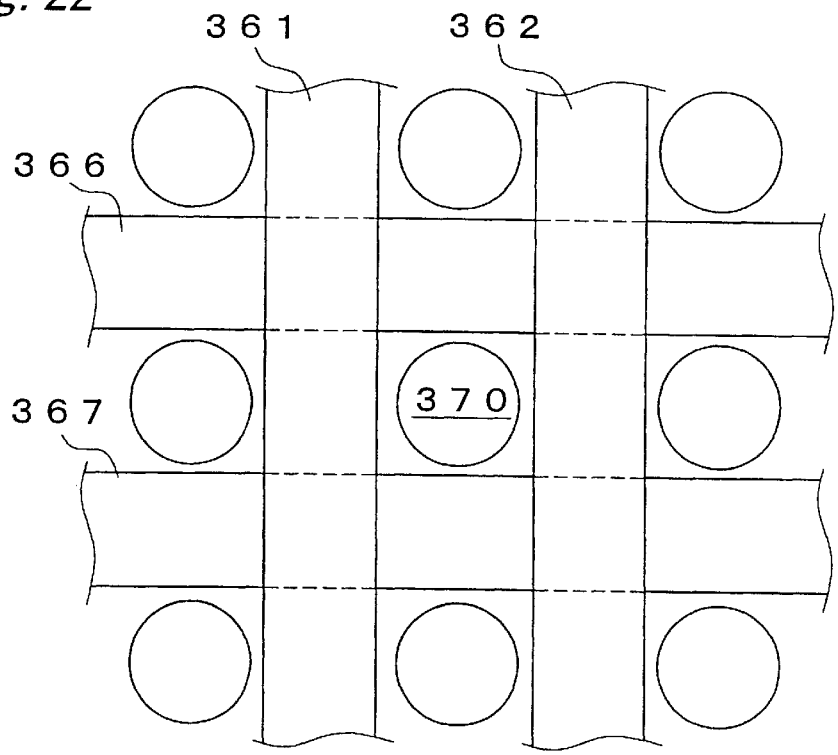
FIG. 22 is a view showing the arrangement of magnetoresistive devices and current lines in the fifth embodiment.

The placement of the magnetoresistive devices and the current lines is explained with reference to FIG. 22, which is a plan view. Referring to FIG. 22, the current lines 361, 362 are placed obliquely above a device 370, and the current lines 366, 367 are placed obliquely below the device 370. In this case, the device is formed in a cylindrical shape as in Embodiment 4.

When the devices are arrayed in matrix shape, recording to a selected device at a point is performed by using the resultant of magnetic fields which are generated by passing currents through the recording lines placed obliquely above and below the selected device.

For example, information recording to the device 370 is performed by passing currents through the current lines 361, 362 placed obliquely above the device and the current lines 366, 367 placed obliquely below the device such that magnetic fields generated from the latter current line are oriented in the same direction as the magnetic fields generated from the current lines 361, 362. In this way, by using the resultant of magnetic fields generated from the four current lines placed obliquely above and below a device, recording to a point of intersection in the device array pattern is performed.

As in Embodiment 4, magnetization information of "0" or "1" is recorded in correspondence to whether the memory layer is magnetized upward or downward.

In this embodiment, a case in which the first magnetic layer is a memory layer and in which recording is done by reversing the magnetization of the memory layer upward of the device is explained.

Figure 23:
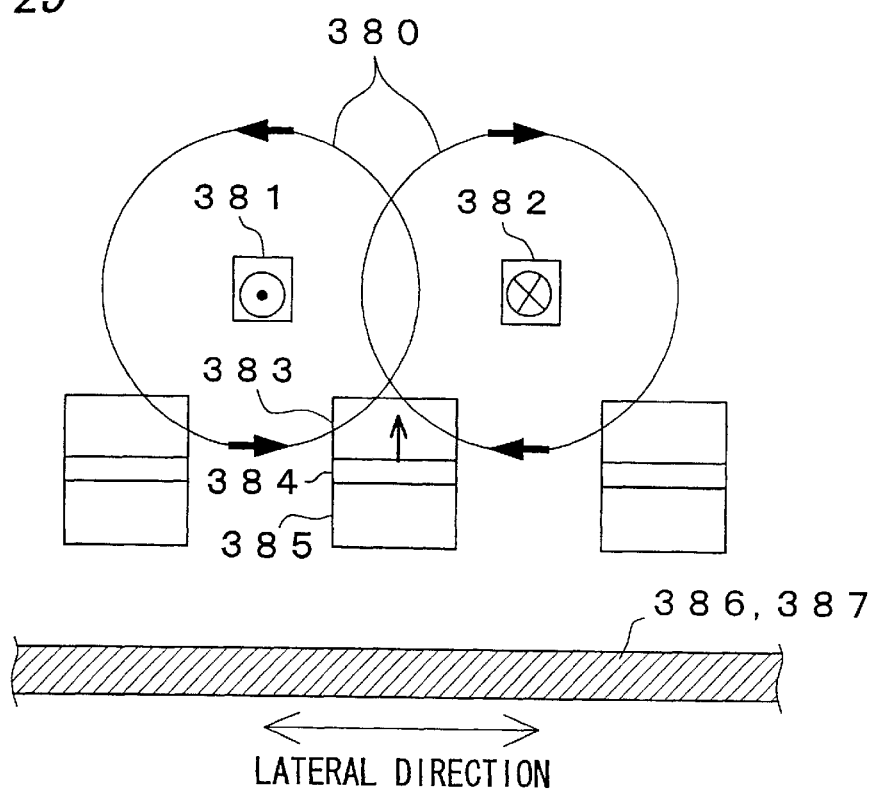
FIG. 23 is an illustration for explaining a recording method of the fifth embodiment.
Figure 24:
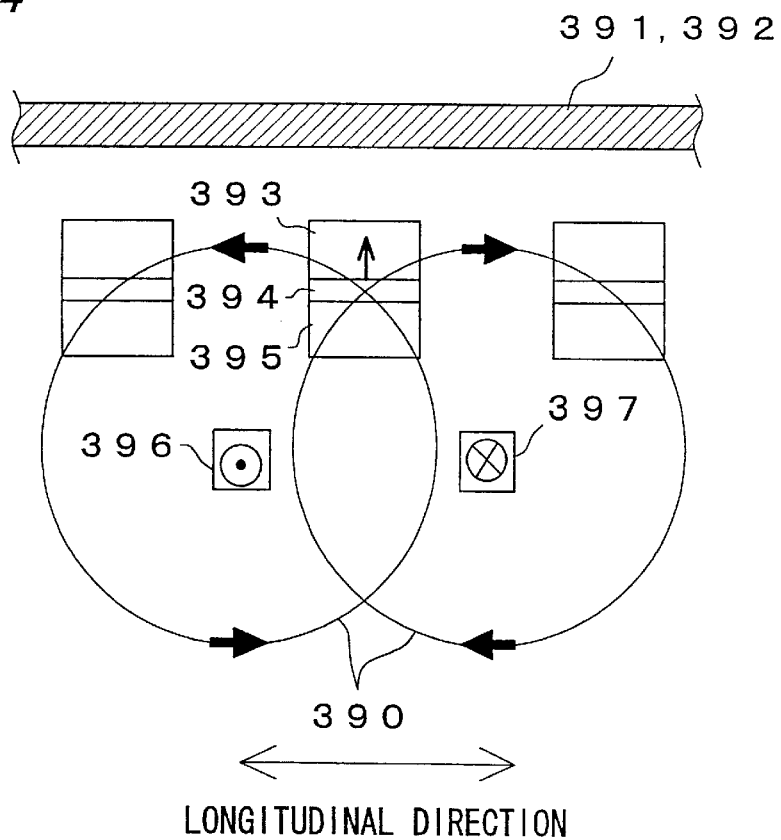
FIG. 24 is an illustration for explaining a recording method of the fifth embodiment.

FIGS. 23 and 24 are sectional views showing devices arranged in the lateral direction and in the longitudinal direction, respectively, with a device to be recorded at the center. The recording to the memory layer of the device to be recorded is done by passing currents through the four recording lines placed obliquely above and below the device, and by using the resultant of the magnetic fields 380 and 390 generated.

FIG. 23 shows a state in which currents are passed through current lines 381, 382 placed obliquely above the selected device. In this state, currents are passed through current lines 381, 382 in opposite directions. However, as in the case of Embodiment 4, when the recording is done by the magnetic fields 380 from the current lines 381, 382, the magnetization of the memory layer 383 is not reversed. Thus, the recording is done by combination of the magnetic fields 380 generated from the current lines 381, 382 with magnetic fields generated from current lines 386, 387 placed obliquely below the device. In FIG. 23, reference numerals 384 and 385 indicate a non-magnetic layer and a magnetic layer, respectively.

FIG. 24 shows a state of magnetic fields 390 generated from the current lines obliquely below the device. To perform the recording to the memory layer 393, currents are also passed through current lines 396, 397 placed obliquely below the device in opposite directions. In the figure, reference numerals 394 and 395 indicate a non-magnetic layer and a magnetic layer, respectively.

As a result, at a point selected for recording, the magnetic fields applied from the obliquely upper current lines and the obliquely lower current lines to the selected device are directed upward at all times as shown in FIGS. 23 and 24, whereby the magnetization or magnetized state of the memory layer is reversed upward.

The magnetoresistive device, to which recording has been done in this way, shows a low resistance value when the magnetization of the first magnetic layer and the magnetization of the second magnetic layer are parallel to each other, and a high resistance value when those magnetizations are antiparallel from each other, as described above.

Although not shown in the drawings, an insulating layer is provided between the write current lines and the magnetoresistive devices.

The write or recording current lines, which are insulated from the devices in Embodiment 5, may be used also for reading recorded information when used in magnetic memories. Alternatively, read current lines may be additionally provided to the structure of Embodiment 5, above and below of each device. In the case that the recording or write current line serves also for reading, wiring to connect the recording current line to the device is required The devices may be fabricated above transistors to constitute a magnetic memory, in which case one side of the devices has to be connected to a transistor. In this case, current lines serving for both recording and reading may be connected to the other side of the devices, or additional current lines for reading may be added to the structure of Embodiment 5.

As is obvious from the above, as compared with the prior art, the present invention can provide a magnetic memory having higher integration and higher selectivity, as well as a recording method therefor.

(Embodiment 6)

Figure 25:
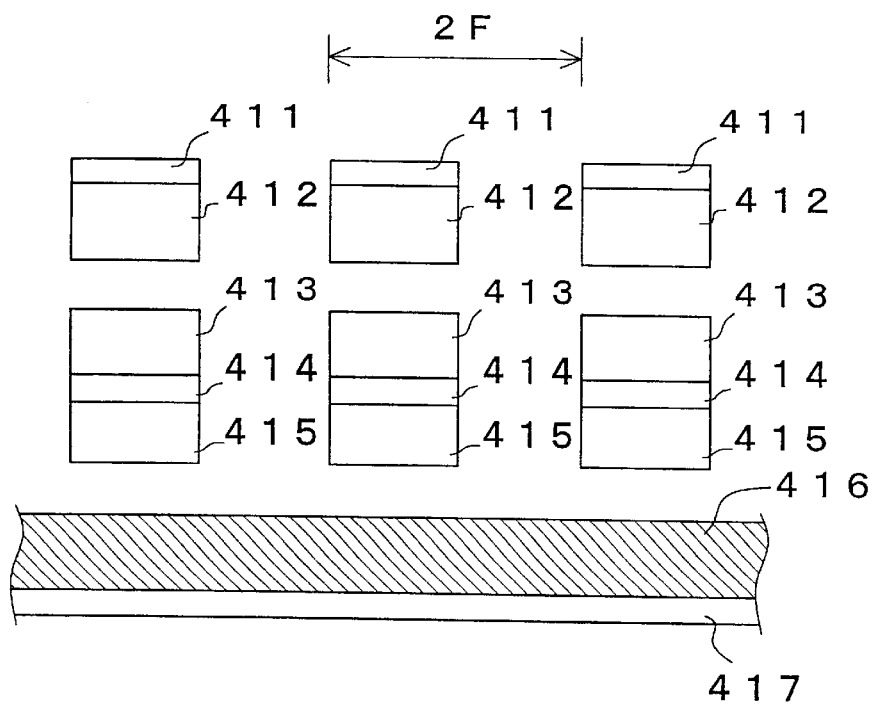
FIG. 25 schematically shows the structure of a magnetic memory according to a sixth embodiment of the invention.

FIG. 25 schematically shows the structure of a magnetic memory according to this embodiment. The magnetic memory of this embodiment is composed of magnetoresistive devices each of which is essentially made up of a first magnetic layer 413, a nonmagnetic layer 414 and a second magnetic layer 415, and current lines 412, 416 placed above and below the respective devices.

Further, high permeability layers 411, 417 are provided on an upper surface of the current lines 412 placed above the devices, and on a lower surface of the current lines 416 placed below the devices, respectively. The provision of the high permeability layers 411, 417 to the current lines 412, 416 concentrates magnetic fields generated from the current lines to the recording layer of the magnetoresistive device, thus allowing an efficient recording to be achieved.

In the magnetic memory of Embodiment 6, the distance between the adjacent devices is 2F when expressed by the minimum wiring rule F. That is, in the magnetic memory of Embodiment 6, the distance between the adjacent devices, namely the pitch of the devices has been reduced to a half of the pitch 4F of a magnetic memory in which recording current lines are placed beside the devices as in the prior art. This indicates that according to this embodiment, high integration has been achieved.

The current lines 412, 416 are made of an electrically conductive nonmagnetic material such as Al or Cu. Also, as the material of the high permeability layers 411 and 417 provided on the upside of the current lines 412 and the downside of the current lines 416, NiFe, CoZrNb or the like can be used.

Both the first magnetic layer 412 and the second magnetic layer 415 are made of a perpendicularly magnetized film of a rare earth element (RE)-transition metal (TM) amorphous alloy, or a perpendicularly magnetized film of CoCr-based alloy or other crystalline alloys.

Assuming that the first magnetic layer 413 is a recording or memory layer, the first magnetic layer 413 should have a coercive force Hc low enough to enable magnetization reversal by the current lines, and also should maintain the perpendicular magnetic anisotropy. Materials of the first magnetic layer 413 satisfying these conditions are exemplified by binary alloys (CeCo, PrCo, etc.) containing a light rare earth metal such as Ce, Pr and a transition metal or ternary alloys (PrGdFe, PrGdCo, PrTbFe, PrTbCo, PrFeCo, etc.) containing a light rare earth metal, a heavy rare earth metal, and a transition metal.

Meanwhile, the second magnetic layer 415 is required to, while maintaining the perpendicular magnetic anisotropy, have a coercive force large enough to resist full magnetization reversal by magnetic fields generated from the current lines. Materials suitable for the second magnetic layer 415 satisfying these conditions are exemplified by binary alloys (TbFe, TbCo, GdFe, GdCo, etc.) composed principally of a transition metal and a heavy rare earth metal such as Tb and Gd as the rare earth metal, or ternary alloys (GdTbFe, GdTbCo, TbFeCo, etc.) composed of heavy rare earth metal—transition metal, or further ferromagnetics having perpendicular magnetic anisotropy such as CoCr and CoPt.

On the one hand, taking into consideration the possibility of going superparamagnetic because of too a small film thickness, it is preferable that the first magnetic layer and the second magnetic layer have a film thickness of 50 Å or more. On the other hand, in view of difficulty in fabricating micro devices, it is preferable that these magnetic layers have a film thickness of 5000 Å or less.

For the nonmagnetic layer 414, either a nonmagnetic material having electrical conductivity, such as Cu, used for conventional GMR devices or an $Al_2O_3$ film used for TMR devices may be used. However, with consideration given to the risk that the rare earth metals of the magnetic layer may be oxidized, it is desirable to use, as a material of the insulative nonmagnetic layer, a nitride film of AlN, BN or the like or a film having covalent bonds of Si, diamond, DLC or the like.

As to the film thickness of the nonmagnetic layer, in the case of a TMR device, film thicknesses below 5 Å would cause short-circuits of the magnetic layers, while film thicknesses above 30 Å would make the electron tunneling phenomenon less likely to occur. Thus, the film thickness of the nonmagnetic layer is preferably 5 Å or more, but 30 Å or less. In the case of a GMR device, on the other hand, with the increasing film thickness of the nonmagnetic layer, device resistance becomes too small and the rate of change of magnetoresistance also reduces. Thus, the film thickness is preferably not more than 50 Å.

Although not shown, in order to prevent the current lines and the magnetoresistive devices from being electrically connected to each other, an insulating film is provided between the current lines and the magnetoresistive devices. This is intended to prevent a reproduction signal from deteriorating due to leakage to the recording current lines of a current that is passed through magnetic thin-film devices during a reproduction or read operation.

Next, the device array and the placement of the current lines will be explained with reference to FIG. 26. In this embodiment, cylindrically-shaped devices are used in order to maintain the internal magnetized state of the magnetic layers stable.

As described before, magnetoresistive devices 421–425, current lines 426a–426c, and current lines 427a–427c are present on different planes, namely at different levels. In this case, the current lines 426a, 426b, 426c are present on an upper plane which is located above a plane for the devices 421–425, and the current lines 427a, 427b, 427c are present on a lower plane below the plane for the devices 421–425. The current lines 426a, 426b, 426c extend in a lateral direction above the devices 424, 422, 425, respectively, while the current lines 427a, 427b, 427c extend in a lateral direction below the devices 421, 422, 423 respectively.

Figure 26:
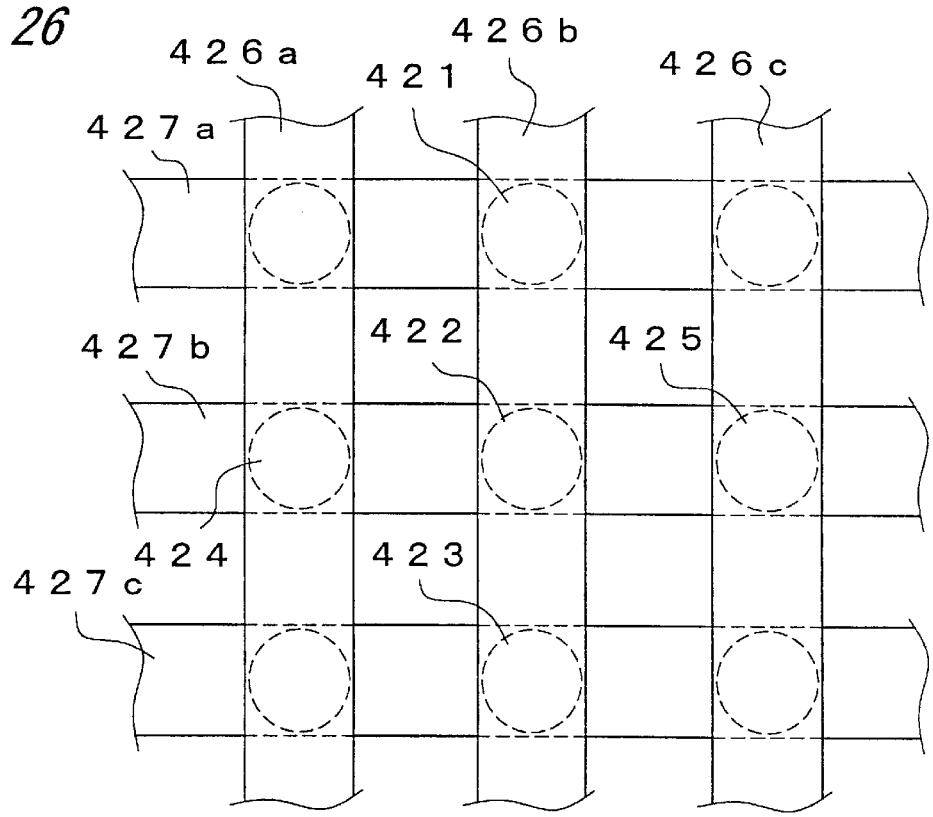
FIG. 26 is a view showing the arrangement of magnetoresistive devices and current lines in the sixth embodiment.

The following will explain a method for selecting the device 422 present at a point in a matrix shape arrangement of the devices as shown in FIG. 26.

Devices in columns are selected by passing currents through the recording current lines 426a and 426c. However, since devices in rows cannot be selected (in other words, all of the devices 421, 422, 423 will be selected), currents are passed through other two recording current lines 427a and 427c as well, by which the point 422 can be selected.

As described in FIG. 25, layers made of high permeability material are provided on the recording current lines 426a, 426b, 426c and under the recording current lines 427a, 427b, 427c.

Figure 27A:
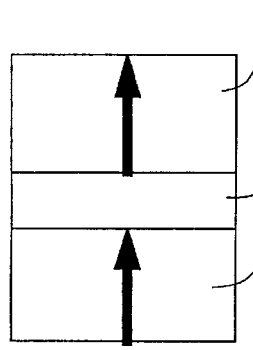
FIGS. 27A and 27B are views showing magnetized states for a "0" and a "1," respectively, in the magnetoresistive device.
Figure 27B:
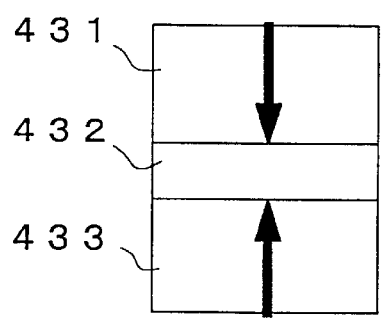

As shown in FIGS. 27A and 27B, in a magnetoresistive device essentially made up of a first magnetic layer 431, a nonmagnetic layer 432 and a second magnetic layer 433, magnetization information of "0" or "1" is recorded in correspondence to whether the recording or memory layer (first magnetic layer 431) is magnetized upward (FIG. 27A) or downward (FIG. 27B).

On the other hand, for reading of the recorded information, "0" or "1" is identified according to the difference in resistance value that depends on the relative directions of the magnetization of the first magnetic layer 431 and the second magnetic layer 433. That is, the magnetoresistive device shows a low resistance value when the magnetization of the first magnetic layer 431 and the magnetization of the second magnetic layer 433 are parallel to each other as shown in FIG. 27A, and a high resistance value when the magnetization of the first magnetic layer 431 and the magnetization of the second magnetic layer 433 are antiparallel as shown in FIG. 27B.

Figure 28:
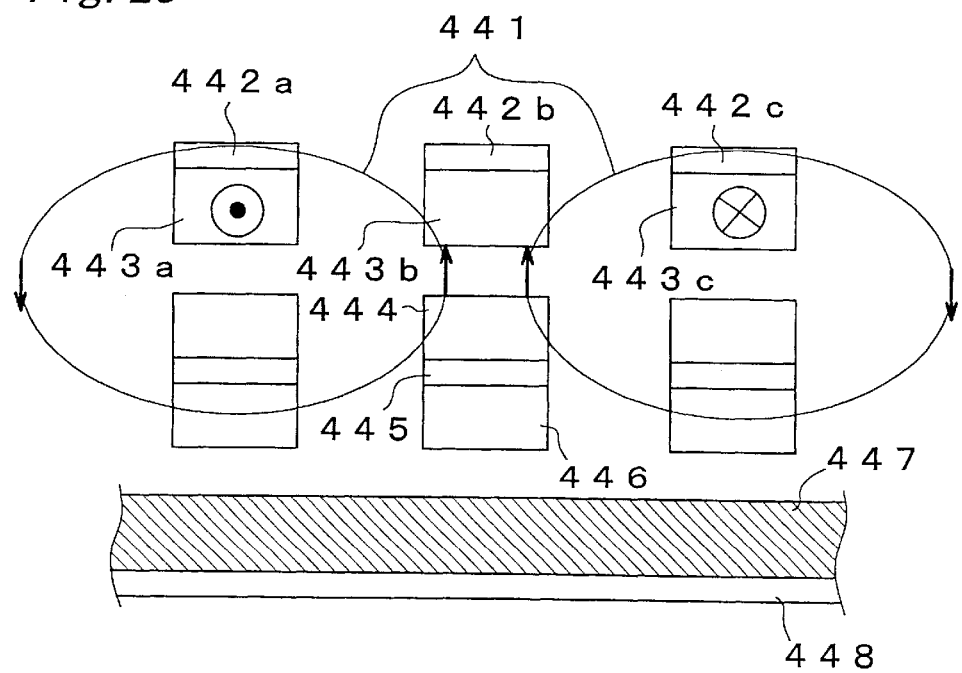
FIG. 28 is a view for explaining a recording method of the sixth embodiment.
Figure 29:
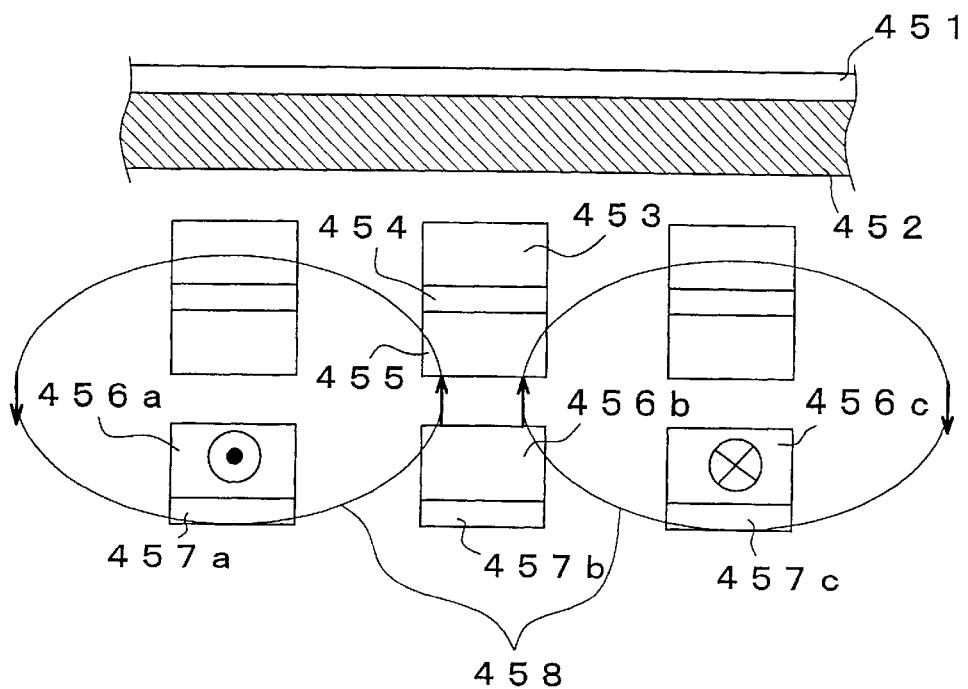
FIG. 29 is a view for explaining a recording method of the sixth embodiment.

Next, the recording method according to the present embodiment is described in detail with reference to FIGS. 28 and 29.

Recording to a magnetoresistive device in this embodiment is done by using the resultant of the magnetic fields generated from current lines 443a, 443c placed above devices (each having layers 444–446) shown in FIG. 28 or current lines 456a, 456c placed below devices (each having layers 453–455) shown in FIG. 29.

In this case, currents are passed through the current lines 443a and 443c and through the current lines 456a and 456c in directions opposite to each other.

Magnetic fields 441 generated from the current lines 443a, 443c and magnetic fields 458 generated from the current lines 456a, 456c are formed elliptical thanks to the high permeability layers (442a, 442c, 457a, 457c) placed on the upside or the underside of the current lines.

With high permeability material placed on the upside or the underside of the current lines like this, magnetic fields generated from the current lines are intercepted on the high permeability layer side. Therefore, the magnetic fields around the current lines become asymmetric, and apply a stronger magnetic field toward the device side. As a result, magnetization of the recording layer can be reversed more efficiently, compared with the case where no high permeability material is placed.

The recording method shown above is for magnetizing the recording layers 444, 453 of the magnetoresistive device upward. The recording layers 444, 453 can be magnetized downward just by reversing the directions in which the currents are passed through the recording current lines 443a, 443c, 456a and 456c shown in FIGS. 28 and 29. In these figures, reference numerals 443b, 447, 456b, and 452 denote current lines and reference numerals 442b, 448, 457b, 451 denote high permeability layers.

When the above devices are used as a magnetic memory, read current lines are required. The read current line needs to be connected with upper and lower sides of the device. Although such read current lines may be provided independently of the recording current lines, yet it is also possible to connect the recording current lines to the devices so that the recording current lines serve also as the read current lines.

For application of the magnetoresistive devices to magnetic memories, there has been discussed a structure that the devices are provided on transistors, in which case the underside of the device has to be connected to the transistor. Therefore, when the device is stacked on a transistor, the recording current line placed above the device can be used also as the read current line, but the recording current line placed below the device is present independently.

(Embodiment 7)

Figure 30:
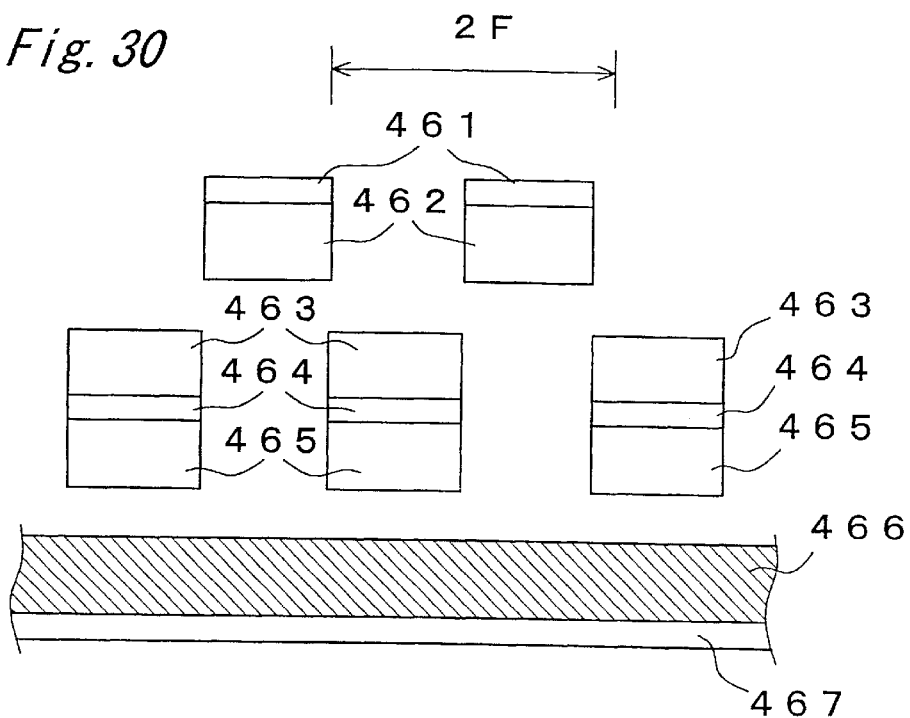
FIG. 30 schematically shows the structure of a magnetic memory according to a seventh embodiment of the invention.

FIG. 30 schematically shows the structure of a magnetic memory according to Embodiment 7 of the invention. The magnetic memory of this embodiment is composed of magnetoresistive devices each essentially made up of a magnetic layer 463, a nonmagnetic layer 464 and a magnetic layer 465, and current lines 462, 466 placed on a plane different from that of the devices and intermediate between the adjacent devices.

Further, high permeability layers 461, 467 are provided on an upper surface of the current lines 462 placed above the devices, and on a lower surface of the current lines 466 placed below the devices, respectively. The provision of the high permeability layers 461, 467 to the current lines 462, 466 concentrates magnetic fields generated from the current lines to the recording layer of the magnetoresistive device, thus allowing an efficient recording to be achieved.

In the magnetic memory of Embodiment 7, similarly to Embodiment 6, the distance between the adjacent devices is 2F when expressed by the minimum wiring rule F. That is, in the magnetic memory of Embodiment 7 as well, the distance between the adjacent devices, namely the pitch of the devices has been reduced to a half of the pitch 4F of the prior art magnetic memory.

Next, the device array and the placement of the current lines will be explained with reference to FIG. 31. In this embodiment, cylindrically-shaped devices are used as in Embodiment 6, in order to maintain the internal magnetized state of the magnetic layers stable.

As shown in FIG. 30, magnetoresistive devices 471–475 and recording current lines 476–479 are present on different planes, namely on different levels. In this case, the current lines 476, 477 are present on an upper plane which is located above a plane for the devices 471–475. The current line 476 is located equidistant from the devices 472 and 474 while the current line 477 is located equidistant from the devices 472 and 475. On the other hand, the current lines 478, 479 are present on a lower plane below the plane for the devices 471–475. The current line 478 is located equidistant from the devices 471 and 472 while the current line 479 is located equidistant from the devices 472 and 473.

Figure 31:
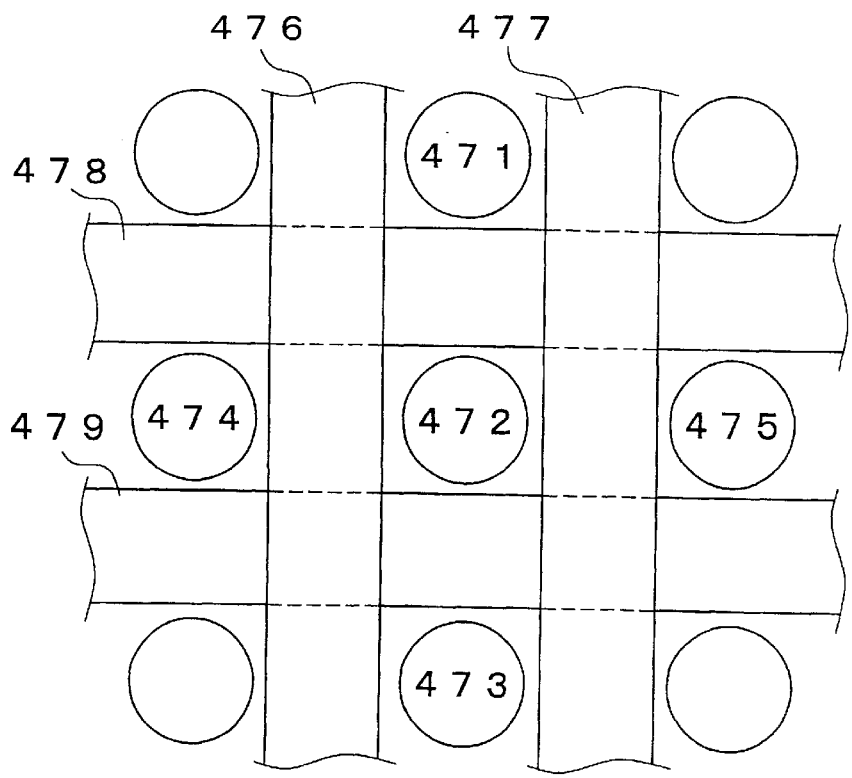
FIG. 31 is a view showing the arrangement of magnetoresistive devices and current lines in the seventh embodiment.

The following will explain a method for selecting the device 472 present at a point in a matrix shape arrangement of the devices as shown in FIG. 31.

Devices in columns are selected by passing currents through the recording current lines 476 and 477. However, since devices in rows cannot be selected (in other words, all of the devices 471, 472, 473 will be selected), currents are passed through other two recording current lines 478 and 479 as well, by which the point 472 can be selected.

As described with reference to FIG. 30, layers made of high permeability material are provided on the recording current lines 476, 477 and under the current lines 478, 479.

Device structure and materials used for the magnetic memory in Embodiment 7 are the same as Embodiment 6.

Figure 32:
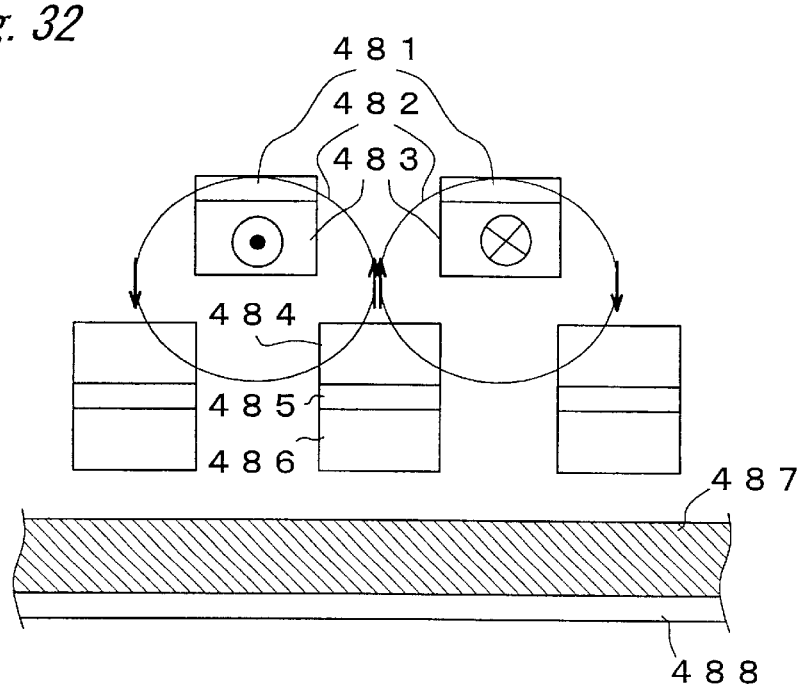
FIG. 32 is a view for explaining a recording method of the seventh embodiment.
Figure 33:
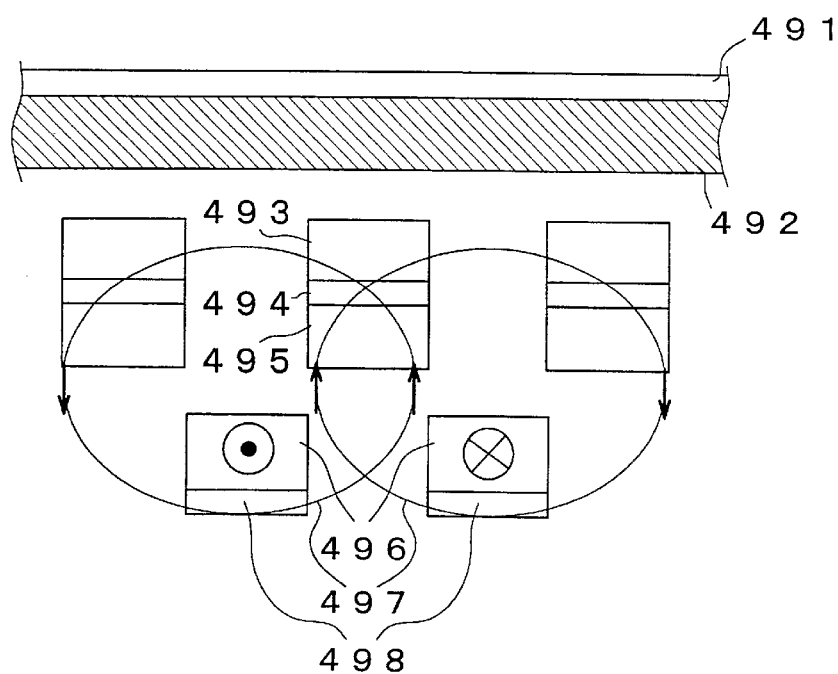
FIG. 33 is a view for explaining a recording method of the seventh embodiment.

The recording method in this embodiment will be described in detail with reference to FIGS. 32 and 33. Recording to a magnetoresistive device in this embodiment is done by using the resultant of the magnetic fields 482, 497 generated from current lines 483 placed above devices (each having layers 484–486) shown in FIG. 32 or current lines 496 placed below devices (each having layers 493–495) shown in FIG. 33. At this time, currents are passed through the current lines adjacent to each other in directions opposite to each other.

Magnetic fields 482 generated from the current lines 483 and magnetic fields 497 generated from the current lines 496 are formed elliptical thanks to the high permeability layers 481, 498 placed on the upside or the underside of the current lines. With high permeability material placed on the upside or the underside of the current lines like this, magnetic fields generated from the current lines are intercepted on the high permeability layer side. Therefore, the magnetic fields around the current lines become asymmetric, and apply a stronger magnetic field toward the device side. As a result, magnetization of the recording layer can be reversed more efficiently, compared with the case where no high permeability material is placed.

The recording method shown above is for magnetizing the recording layers 484, 493 of the magnetoresistive device upward. The recording layers 484, 493 can be magnetized downward just by reversing the directions in which the currents are passed through the recording current lines 483, 496 shown in FIGS. 32 and 33. In these figures, reference numerals 487, 492 denote current lines, and reference numerals 488, 491 denote high permeability layers.

When the above devices are used as a magnetic memory, read current lines are required. The read current line needs to be connected with upper and lower sides of the device. Although such read current lines may be provided independently of the recording current lines, yet it is also possible to connect the recording current lines to the devices so that the recording current lines serve also as the read current lines as well.

For application of the magnetoresistive devices to magnetic memories, there has been discussed a structure that the devices are superposed on transistors, in which case the underside of the device has to be connected to the transistor. Therefore, when the device is superposed on a transistor, the recording current line placed above the device can be used also as the read current line, but the recording current line placed below the device is present independently.

As shown above, according to the present invention, there can be provided a magnetic memory, as well as a method for recording to the magnetic memory, which is higher in integration and higher in recording efficiency than the prior art.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A magnetoresistive device for recording and stably maintaining magnetization information, said device comprising a recording magnetic layer, a nonrecording magnetic layer, and a nonmagnetic layer being interposed between the recording and nonrecording magnetic layers, characterized in that:

the nonrecording magnetic layer is made of a magnetic material having a coercive force high enough to prevent magnetization leakage within said device and low saturation magnetization, and the recording magnetic layer is made of a magnetic material having a coercive force low enough to allow the reversal of its magnetization direction by an oppositely directed external electric field and magnetic anisotropy energy high enough to maintain perpendicular magnetic anisotropy therein at all times.

2. The magnetoresistive device of claim 1, wherein either the recording magnetic layer or the nonrecording magnetic layer is made of a ferromagnetic material that has a compensation point around room temperature.

3. The magnetoresistive device of claim 2, wherein said nonmagnetic layer is made of an insulator.

4. The magnetoresistive device of claim 1, wherein the recording magnetic layer is made of a ferromagnetic material while the nonrecording magnetic layer is made of a ferromagnetic material comprising a rare earth metal-transition metal amorphous alloy that has small saturation magnetization.

5. The magnetoresistive device of claim 1, wherein the recording magnetic layer is made of a ferromagnetic material.

6. The magnetoresistive device of claim 5, wherein the recording magnetic layer is composed of an amorphous alloy of rare earth metal including at least a light rare earth metal, and a transition metal.

7. The magnetoresistive device of claim 5, wherein the nonrecording magnetic layer is formed of a ferromagnetic material.

8. The magnetoresistive device of claim 7, wherein the nonrecording magnetic layer is composed of an amorphous alloy of a rare earth metal including at least a heavy rare earth metal, and a transition metal.

9. The magnetoresistive device of claim 5, wherein the nonrecording magnetic layer is made of a ferromagnetic material that has a compensation point around room temperature.

10. The magnetoresistive device of claim 5, wherein the nonmagnetic layer is made of an insulator.

11. The magnetoresistive device of claim 1, further comprising a second nonrecording magnetic layer having perpendicular magnetic anisotropy and a second nonmagnetic layer which is interposed between the recording magnetic layer and the second nonrecording magnetic layer, wherein the recording magnetic layer is made of a ferromagnetic material.

12. A magnetic memory using, as memory cells, the magnetoresistive devices of claim 1.

13. The magnetic memory of claim 12, wherein either the recording magnetic layer or the nonrecording magnetic layer is made of a ferromagnetic material that has a compensation point around room temperature.

14. The magnetic memory of claim 12, wherein the recording magnetic layer of each megnetoresistive device is made of a ferromagnetic material.

15. The magnetic memory of claim 12, wherein each magnetoresistive device further comprises a second nonrecording magnetic layer having perpendicular magnetic anisotropy and a second nonmagnetic layer which is interposed between the recording magnetic layer and the second nonrecording magnetic layer, wherein the recording magnetic layer is made of a ferromagnetic material.

16. A magnetic memory using magnetoresistive devices, each magnetoresistive device having a first magnetic layer, a nonmagnetic layer, and a second magnetic layer, with the nonmagnetic layer being interposed between the first and second magnetic layers, the first and second magnetic layers having perpendicular magnetic anisotropy, characterized in that:

current lines for recording information to the magnetoresistive devices are provided in planes upper and lower than the plane on which the magnetoresistive devices are located.

17. The magnetic memory of claim 16, wherein the current lines are positioned directly above and below the magnetoresistive devices.

18. The magnetic memory of claim 16, wherein the current lines are located in positions between mutually adjacent magnetoresistive devices.

19. The magnetic memory of claim 16, wherein a layer of high permeability material is provided on each of the current lines.

20. The magnetic memory of claim 16, wherein the magnetoresistive devices are arranged in matrix shape, and the current lines in the upper plane extend in a direction crossing a direction in which the current lines in the lower plane extend.

21. A recording method for the magnetic memory of claim 16, wherein electric currents are passed through two current lines that are positioned in the upper plane and adjacent to a selected magnetoresistive device while electric currents are passed through two current lines that are positioned in the lower plane and adjacent to the selected magnetoresistive device so that information is recorded to the selected magnetoresistive device.

22. The recording method of claim 21, wherein the electric currents are passed in opposite directions through the two current lines in the upper plane and also through the two current lines in the lower plane.

23. The recording method of claim 21, wherein a high permeability layer is provided on each of the current lines.

* * * * *